(12) United States Patent
Yokoyama et al.

(10) Patent No.: US 12,360,172 B2
(45) Date of Patent: Jul. 15, 2025

(54) ABNORMALITY DETECTION DEVICE AND ABNORMALITY DETECTION METHOD THEREOF

(71) Applicant: TOYOTA JIDOSHA KABUSHIKI KAISHA, Aichi-ken (JP)

(72) Inventors: Daiki Yokoyama, Gotemba (JP);
Toshiya Hashimoto, Miyoshi (JP);
Shuntaro Okazaki, Shizuoka-ken (JP);
Shogo Tsuge, Fuji (JP); Kazuhisa Matsuda, Shizuoka-ken (JP)

(73) Assignee: TOYOTA JIDOSHA KABUSHIKI KAISHA, Aichi-Ken (JP)

( * ) Notice: Subject to any disclaimer, the term of this patent is extended or adjusted under 35 U.S.C. 154(b) by 650 days.

(21) Appl. No.: 17/749,154

(22) Filed: May 20, 2022

(65) Prior Publication Data
US 2023/0003811 A1    Jan. 5, 2023

(30) Foreign Application Priority Data

Jun. 30, 2021 (JP) .................................. 2021-109528

(51) Int. Cl.
*G01R 31/40* (2020.01)
*G01R 31/52* (2020.01)
*H02J 3/00* (2006.01)
*B60L 53/68* (2019.01)

(52) U.S. Cl.
CPC ............ *G01R 31/40* (2013.01); *G01R 31/52* (2020.01); *H02J 3/0012* (2020.01); *B60L 53/68* (2019.02)

(58) Field of Classification Search
CPC ....... G01R 31/40; G01R 31/52; H02J 3/0012; H02J 50/12; H02J 50/40; H02J 2310/48; B60L 53/68; B60L 5/005; B60L 2240/12; B60L 2240/68; B60L 2240/80; B60L 2270/32; B60L 53/60; B60L 53/12; Y02T 10/70; Y02T 10/7072; Y02T 90/12; Y02T 90/16
See application file for complete search history.

(56) References Cited

U.S. PATENT DOCUMENTS

| | | | | |
|---|---|---|---|---|
| 2015/0324798 A1* | 11/2015 | Kai | ...................... | G06Q 20/145 705/40 |
| 2021/0309119 A1* | 10/2021 | Ezer | ....................... | B60L 53/62 |
| 2022/0072965 A1 | 3/2022 | Mazaki et al. | | |

FOREIGN PATENT DOCUMENTS

| | | |
|---|---|---|
| JP | 2012-133986 A | 7/2012 |
| JP | 2013-038924 A | 2/2013 |
| JP | 2018157686 A | 10/2018 |
| JP | 2020-159727 A | 10/2020 |
| JP | 2020-188649 A | 11/2020 |

* cited by examiner

*Primary Examiner* — Nha T Nguyen
(74) *Attorney, Agent, or Firm* — HAUPTMAN HAM, LLP

(57) ABSTRACT

Submitted is an abnormality detection device including a processing unit, and a communication unit that can communicate with a ground electric power supply device that transmits electric power to a vehicle in a non-contact manner. The processing unit is configured to detect electricity theft or electricity leakage in the ground electric power supply device, based on a time dependent change pattern of an electric power supply amount of the ground electric power supply device or a parameter that is correlated to the electric power supply amount, the time dependent change pattern being a time dependent change mode.

15 Claims, 13 Drawing Sheets

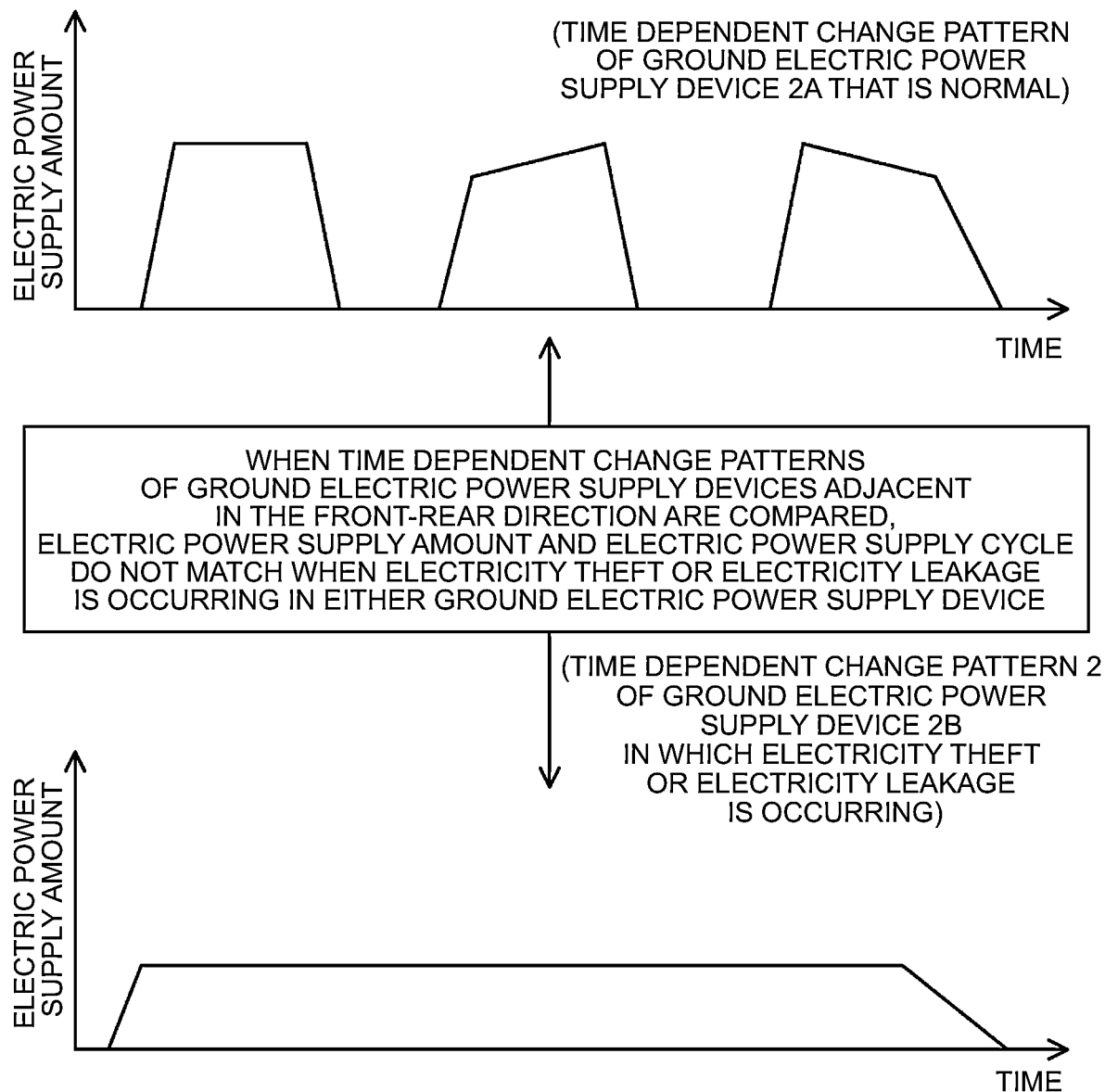

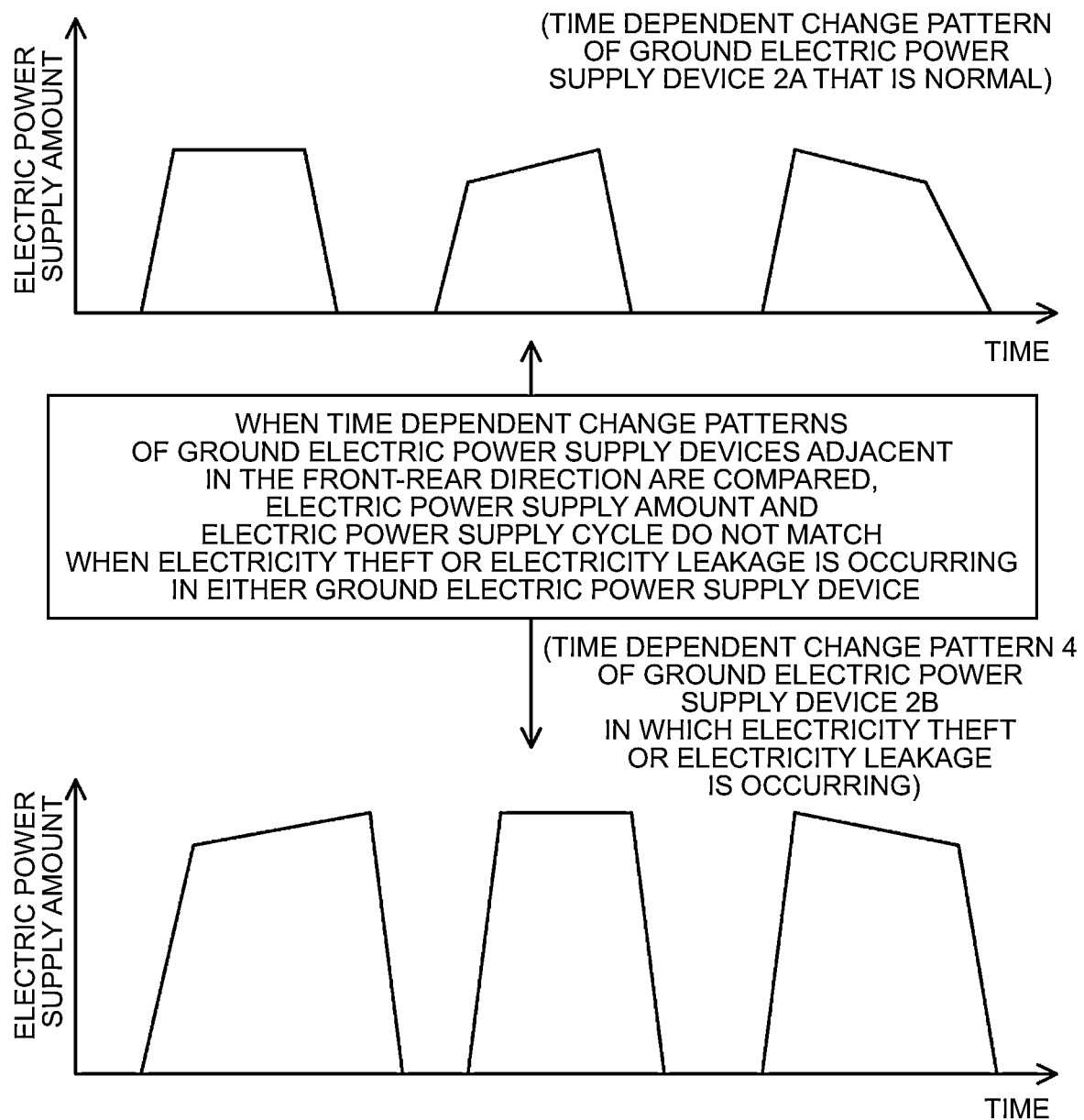

ABNORMALITY DETECTION DEVICE AND ABNORMALITY DETECTION METHOD THEREOF

CROSS-REFERENCE TO RELATED APPLICATION

This application claims priority to Japanese Patent Application No. 2021-109528 filed on Jun. 30, 2021, incorporated herein by reference in its entirety.

BACKGROUND

1. Technical Field

The present disclosure relates to an abnormality detection device and an abnormality detection method thereof.

2. Description of Related Art

Conventionally known is a non-contact electric power supply system that transmits electric power to a traveling vehicle in a non-contact manner from a ground electric power supply device provided on the ground, by using a transmission method such as magnetic field coupling (electromagnetic induction), electric field coupling, magnetic field resonance coupling (magnetic field resonance), and electric field resonance coupling (electric field resonance) (see Japanese Unexamined Patent Application Publication No. 2018-157686 (JP 2018-157686 A)).

SUMMARY

The conventional non-contact electric power supply system does not have a means for detecting electricity theft or electricity leakage from the ground electric power supply device, and therefore, there is a problem that it is difficult to detect electricity theft or electricity leakage.

The present disclosure is an abnormality detection device and an abnormality detection method thereof that enables detection of electricity theft or electricity leakage from a ground electric power supply device.

A first aspect of the present disclosure relates to an abnormality detection device including a processing unit and a communication unit that is able to communicate with a ground electric power supply device that transmits electric power to a vehicle in a non-contact manner. Then, the processing unit is configured to detect electricity theft or electricity leakage in the ground electric power supply device based on a time dependent change pattern that is a time dependent change mode of an electric power supply amount of the ground electric power supply device.

According to the abnormality detection device of the first aspect described above, it is possible to detect electricity theft or electricity leakage from the ground electric power supply device.

In the abnormality detection device of the first aspect described above, the processing unit may be configured to determine that electricity theft or electricity leakage is occurring in the ground electric power supply device when an electric power supply is continuously performed based on the time dependent change pattern of the ground electric power supply device.

In the abnormality detection device of the first aspect described above, the processing unit may be configured to determine that electricity theft or electricity leakage is occurring in the ground electric power supply device when the processing unit determines that an electric power supply is not periodically performed based on the time dependent change pattern of the ground electric power supply device.

In the abnormality detection device of the configuration described above, the processing unit may be configured to take into consideration, at least one of a congestion degree and a traffic jam degree of a road on which the ground electric power supply device is installed, when the time dependent change pattern of the ground electric power supply device is acquired, at the time of determining whether the electric power supply is continuously or periodically performed.

In the abnormality detection device of the first aspect described above, the processing unit may be configured to determine that electricity theft or electricity leakage is not occurring in the ground electric power supply device when the processing unit determines that an electric power supply is intermittently performed based on the time dependent change pattern of the ground electric power supply device.

In the abnormality detection device of the first aspect described above, the processing unit may be configured to determine that electricity theft or electricity leakage is occurring in the ground electric power supply device, when the time during which the electric power supply amount of the ground electric power supply device is larger than zero or a predetermined amount that is able to be regarded as zero is a predetermined time or more.

In the abnormality detection device of the first aspect described above, the predetermined time may be set in consideration of at least one of the congestion degree and the traffic jam degree of a road on which the ground electric power supply device is installed.

In the abnormality detection device of the configuration described above, the congestion degree may be set based on the number of vehicles passing through the road per predetermined time, and the traffic jam degree may be set based on a traveling speed of the vehicle passing through the road.

In the abnormality detection device of the first aspect described above, the processing unit may be configured to, when the time during which the electric power supply amount of the ground electric power supply device is larger than zero or a predetermined amount that is able to be regarded as zero is a predetermined time or more, determine that electricity theft is occurring in the ground electric power supply device when a peak value of the electric power supply amount is a predetermined value or more, and the processing unit may be configured to determine that electricity leakage is occurring in the ground electric power supply device when the peak value of the electric power supply amount is less than the predetermined value.

In the abnormality detection device of the first aspect described above, the processing unit may be configured such that when the processing unit determines that electricity theft or electricity leakage is occurring in the ground electric power supply device, the processing unit commands prohibition of an electric power supply to the ground electric power supply device via the communication unit.

In the abnormality detection device of the first aspect described above, the communication unit is configured to be able to communicate with an external related organization, and the processing unit may be configured such that when the processing unit determines that electricity theft or electricity leakage is occurring in the ground electric power supply device, the processing unit notifies the external related organization via the communication unit that electricity theft or electricity leakage in the ground electric power supply device is occurring.

In the abnormality detection device of the first aspect described above, a storage unit that is configured to at least store information regarding the time dependent change pattern of a plurality of the ground electric power supply devices may be further provided. The processing unit may be configured to detect electricity theft or electricity leakage of a first ground electric power supply device that is one ground electric power supply device among the ground electric power supply devices, based on the time dependent change pattern of the first ground electric power supply device that is received from the first ground electric power supply device via the communication unit and the time dependent change pattern of a second ground electric power supply device stored in the storage unit.

In the abnormality detection device of the first aspect described above, the second ground electric power supply device may be at least one ground electric power supply device that is installed in a vicinity of the first ground electric power supply device.

A second aspect of the present disclosure relates to an abnormality detection method of an abnormality detection device including a processing unit and a communication unit that is configured to be able to communicate with a ground electric power supply device that transmits electric power to a vehicle in a non-contact manner. The abnormality detection method detects electricity theft or electricity leakage in the ground electric power supply device, based on a time dependent change pattern that is a time dependent change mode of a parameter of an electric power supply amount of the ground electric power supply device a parameter that is correlated to the electric power supply amount.

According to the abnormality detection method of the abnormality detection device of the second aspect described above, it is possible to detect electricity theft or electricity leakage from the ground electric power supply device.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 11B shows an example of a time dependent change pattern of the electric power supply amount of the normal ground electric power supply device and an example of a time dependent change pattern of the electric power supply amount of the ground electric power supply device in which electricity theft or electricity leakage is occurring;

FIG. 11D shows an example of a time dependent change pattern of the electric power supply amount of the normal ground electric power supply device and an example of a time dependent change pattern of the electric power supply amount of the ground electric power supply device in which electricity theft or electricity leakage is occurring.

DETAILED DESCRIPTION OF EMBODIMENTS

Hereinafter, embodiments will be described in detail with reference to the drawings. In the following description, similar components are given the same reference numbers.

Figure 1:
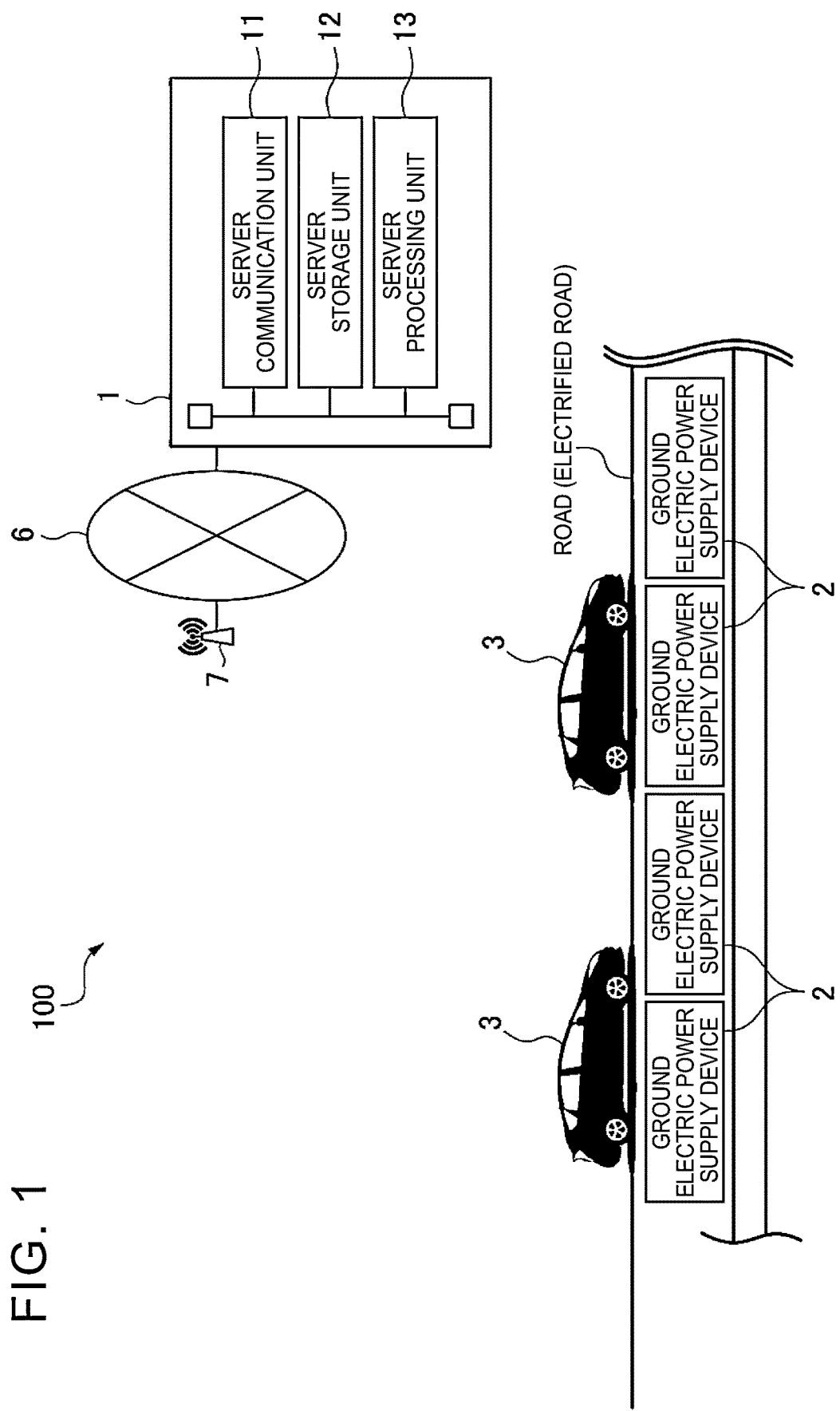
FIG. 1 is a schematic configuration diagram of a non-contact electric power supply system including an abnormality detection device of an embodiment serving as an example of the present disclosure.

An abnormality detection device of an embodiment serving as an example of the present disclosure will be described below. FIG. 1 is a schematic configuration diagram of a non-contact electric power supply system 100 provided with the abnormality detection device.

The non-contact electric power supply system 100 includes a server 1, a plurality of ground electric power supply devices 2 continuously placed along a road at predetermined intervals, and a plurality of vehicles 3 equipped with an electric power receiving device 5 (see FIG. 2) for receiving electric power wirelessly transmitted from the ground electric power supply devices 2. The non-contact electric power supply system performs non-contact electric power transmission by magnetic field resonance coupling (magnetic field resonance) from the ground electric power supply devices 2 to the vehicles 3. In particular, in the first embodiment, the non-contact electric power supply system 100 performs non-contact electric power transmission from the ground electric power supply devices 2 to the vehicles 3 while the vehicles 3 are traveling. Therefore, the ground electric power supply devices 2 transmit electric power to the vehicles 3 in a non-contact manner when the vehicles 3 are traveling, and the vehicles 3 receive electric power in a non-contact manner from the ground electric power supply devices 2 when the vehicles 3 are traveling.

In the present specification, the term "traveling" means a state in which the vehicle is located on the road for traveling. Therefore, the term "traveling" includes not only a state in which the vehicle is actually traveling at an arbitrary speed greater than zero, but also a state in which the vehicle is stopped on the road due to, for example, waiting for a traffic light. On the other hand, even if the vehicle is located on the road, the state is not included as traveling if the vehicle is parked or stopped, for example. Further, in the following description, the road on which the ground electric power supply devices 2 are installed is referred to as an "electrified road" as necessary.

The server 1 includes a server communication unit 11, a server storage unit 12, and a server processing unit 13.

The server communication unit 11 has a communication interface circuit for connecting the server 1 to a network 6 via, for example, a gateway. The server 1 communicates with the ground electric power supply devices 2 and the vehicles 3 via the server communication unit 11, and also communicates with an external related organization (for example, a maintenance company of the ground electric power supply devices 2 or a public institution such as the police) as necessary.

The server storage unit 12 has a storage medium such as a hard disk drive (HDD), an optical recording medium, and a semiconductor memory, and stores various computer programs, data, and the like used for processing in the server processing unit 13.

The server processing unit 13 has one or more central processing units (CPUs) and peripheral circuits thereof. The server processing unit 13 executes various computer programs stored in the server storage unit 12 and collectively controls the overall operation of the server 1, and is, for example, a processor. The processing executed by the server processing unit 13 and the server 1 will be described later with reference to FIG. 5 and the like.

Figure 2:
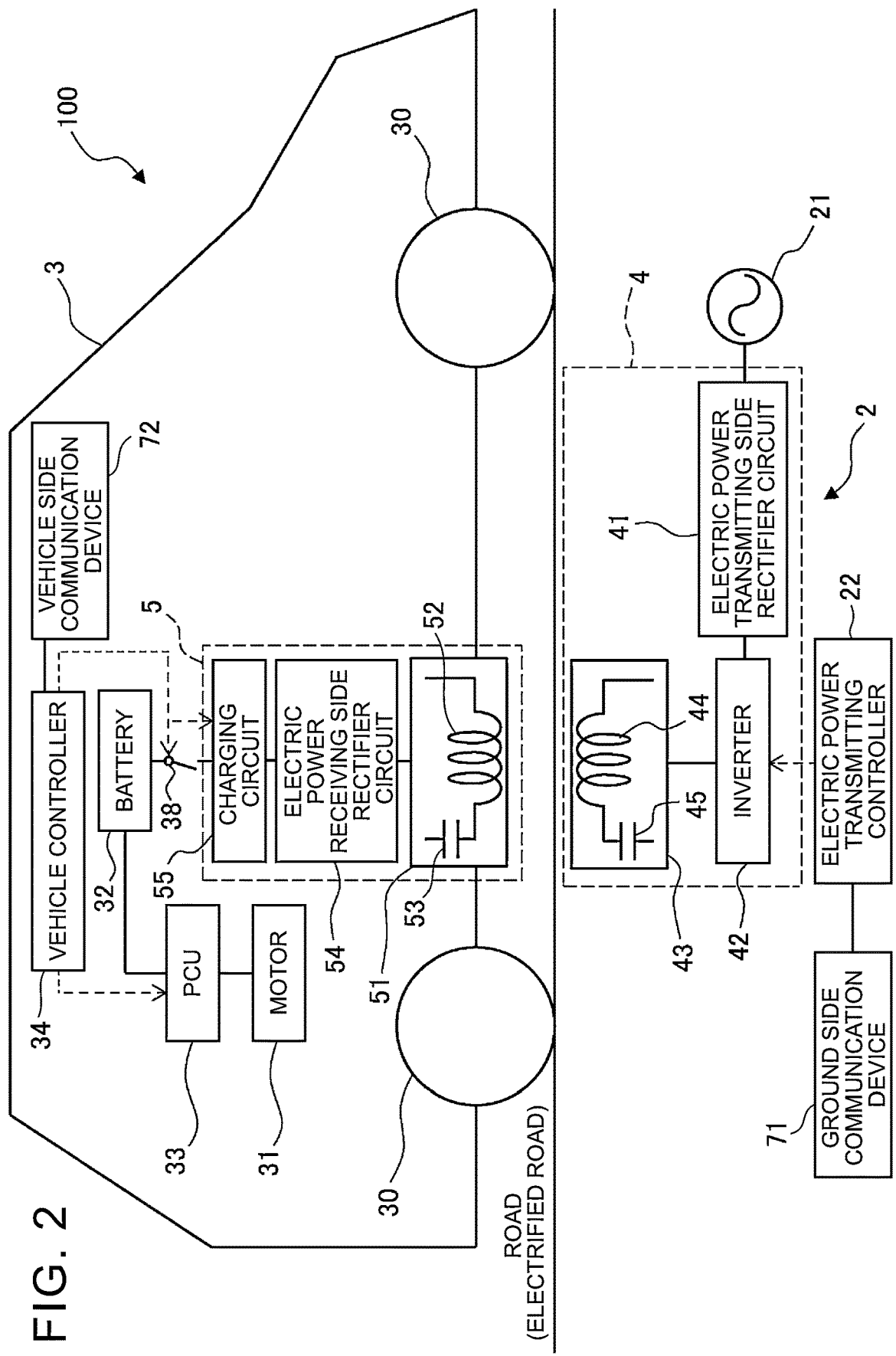
FIG. 2 is a diagram illustrating a detailed configuration of the ground electric power supply device and the vehicle shown in FIG. 1.

FIG. 2 is a diagram illustrating a detailed configuration of the ground electric power supply device 2 and the vehicle 3 according to the first embodiment.

As shown in FIG. 2, the ground electric power supply device 2 includes a ground side communication device 71, an electric power transmitting device 4, an electric power source 21, and an electric power transmitting controller 22. The ground side communication device 71, the electric power source 21, and the electric power transmitting controller 22 may be embedded in the road or may be arranged in a place other than the road (including the ground).

The ground side communication device 71 is configured to be able to communicate with the server 1 and the vehicle 3. In the first embodiment, the ground side communication device 71 accesses a wireless base station 7 (see FIG. 1) connected to the network 6 (see FIG. 1) via a gateway (not shown) or the like, in order to connect to the network 6 via the wireless base station 7. As a result, wireless communication is performed between the ground side communication device 71 and the server 1, and for example, various types of information necessary for performing non-contact electric power supply to the vehicle 3 are exchanged.

Further, the ground side communication device 71 directly performs wireless communication with a vehicle side communication device 72 mounted on each vehicle 3 by using a predetermined wireless communication line, and receives an approach signal transmitted from the vehicle side communication device 72. The approach signal is a signal for notifying that the vehicle 3 is approaching the ground electric power supply device 2, and is a signal to urge the ground electric power supply device 2 that has received the approach signal via the ground side communication device 71 to prepare to transmit power.

The electric power source 21 supplies electric power to the electric power transmitting device 4. The electric power source 21 is, for example, a commercial alternating current (AC) power source that supplies single-layer AC power. The electric power source 21 may be another AC power source that supplies three-phase AC power, or may be a direct current (DC) power source such as a fuel cell.

The electric power transmitting device 4 sends the electric power supplied from the electric power source 21 to the vehicle 3. The electric power transmitting device 4 has an electric power transmitting side rectifier circuit 41, an inverter 42, and an electric power transmitting side resonance circuit 43. In the electric power transmission device 4, the AC power supplied from the electric power source 21 is rectified by the electric power transmitting side rectifier circuit 41 and converted into a DC current, and this DC current is converted into an AC power in the inverter 42, and this AC power is supplied to the electric power transmitting side resonance circuit 43.

The electric power transmitting side rectifier circuit 41 is electrically connected to the electric power source 21 and the inverter 42. The electric power transmitting side rectifier circuit 41 rectifies the AC power supplied from the electric power source 21 and converts it into DC power, and supplies the DC power to the inverter 42. The electric power transmitting side rectifier circuit 41 is, for example, an AC/DC converter.

The inverter 42 is electrically connected to the electric power transmitting side rectifier circuit 41 and the electric power transmitting side resonance circuit 43. The inverter 42 converts the DC power supplied from the electric power transmitting side rectifier circuit 41 into an AC power (high frequency power) having a frequency higher than that of the AC power of the electric power source 21, and supplies the high frequency power to the electric power transmitting side resonance circuit 43.

The electric power transmitting side resonance circuit 43 has a resonator composed of a coil 44 and a capacitor 45. Various parameters of the coil 44 and the capacitor 45 (outer diameter and inner diameter of the coil 44, number of turns of the coil 44, capacitance of the capacitor 45, and the like) are determined so that the resonance frequency of the electric power transmitting side resonance circuit 43 becomes a predetermined set value. The predetermined set value is, for example, 10 kHz to 100 GHz, preferably 85 kHz defined by the SAE TIR J2954 standard as a frequency band for a non-contact electric power transmission.

The electric power transmitting side resonance circuit 43 is arranged in the center of the lane through which the vehicle 3 passes so that the center of the coil 44 is located in the center of the lane. When the high-frequency power supplied from the inverter 42 is applied to the electric power transmitting side resonance circuit 43, the electric power transmitting side resonance circuit 43 generates an AC magnetic field for power transmission. When the electric power source 21 is a DC power supply, the electric power transmitting side rectifier circuit 41 may be omitted.

The electric power transmitting controller 22 is, for example, a general-purpose computer, and performs various controls of the ground electric power supply device 2. For example, the electric power transmitting controller 22 is electrically connected to the inverter 42 of the electric power transmitting device 4 and controls the inverter 42 to control the electric power transmission by the electric power transmitting device 4. Further, the electric power transmitting controller 22 communicates with the server 1 and the vehicle 3 via the ground side communication device 71. The electric power transmitting controller 22 can directly communicate with the vehicle 3 via the ground side communication device 71, or can indirectly communicate with the vehicle 3 from the ground side communication device 71 via the server 1.

Figure 3:
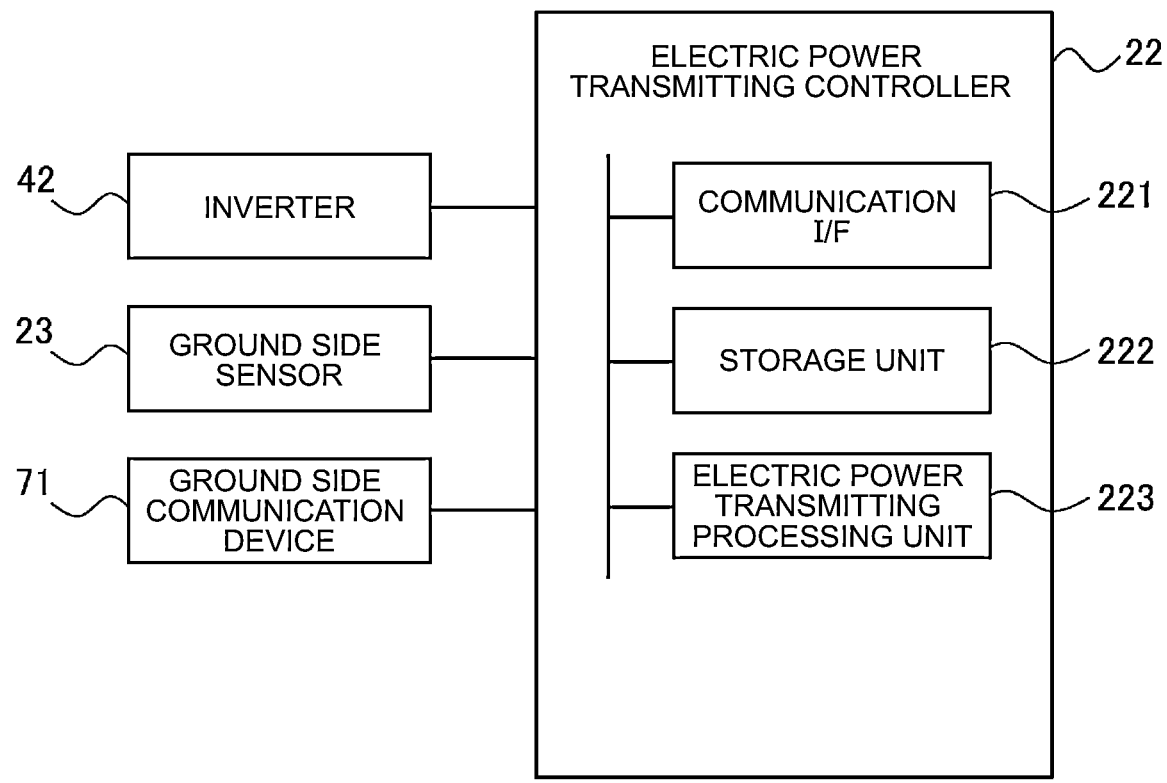
FIG. 3 is a schematic configuration diagram of an electric power transmitting controller shown in FIG. 2 and equipment connected to the electric power transmitting controller.

FIG. 3 is a schematic configuration diagram of the electric power transmitting controller 22 and the equipment connected to the electric power transmitting controller 22.

The electric power transmitting controller 22 includes a communication interface 221, a storage unit 222, and an electric power transmitting processing unit 223. The communication interface 221 and the storage unit 222 and the electric power transmitting processing unit 223 are connected to each other via a signal line.

The communication interface 221 has an interface circuit for connecting the electric power transmitting controller 22 to various devices (for example, the inverter 42, the ground side communication device 71, the ground side sensor 23 described later, and the like) constituting the ground electric power supply device 2. The electric power transmitting controller 22 communicates with various devices constituting the ground electric power supply device 2 via the communication interface 221.

The storage unit 222 has a storage medium such as an HDD, an optical recording medium, and a semiconductor memory, and stores various computer programs, data, and the like used for processing in the electric power transmitting processing unit 223.

The electric power transmitting processing unit 223 has one or more CPUs and peripheral circuits thereof. The electric power transmitting processing unit 223 executes various computer programs stored in the storage unit 222 and collectively controls the overall operation of the ground electric power supply device 2, and is, for example, a processor. When the electric power transmitting processing unit 223 and also the electric power transmitting controller 22 receive an approach signal via, for example, the ground side communication device 71, the electric power transmitting processing unit 223 and the electric power transmitting controller 22 control the ground electric power supply device 2 so as to be able to transmit electric power to the vehicle 3 when the vehicle 3 passes by.

Further, a ground side sensor 23 is connected to the electric power transmitting controller 22. The ground side sensor 23 includes, for example, an electric power transmitting device current sensor that detects the current flowing through various devices (particularly, the electric power transmitting side resonance circuit 43, the inverter 42, and the electric power transmitting side rectifier circuit 41) of the electric power transmitting device 4, an electric power transmitting device voltage sensor that detects the voltage applied to various devices of the electric power transmitting device 4, an electric power transmitting device temperature sensor that detects the temperature of various devices of the electric power transmitting device 4, a foreign matter sensor that detects foreign matter on the road in which the electric power transmitting device 4 is embedded, and a biosensor that detects a living body on the road in which the electric power transmitting device 4 is embedded. The output of the ground side sensor 23 is input to the electric power transmitting controller 22.

Returning to FIG. 2, the vehicle 3 has the vehicle side communication device 72, the electric power receiving device 5, a motor 31, a battery 32, an electric power control unit (PCU) 33, and a vehicle controller 34. The vehicle 3 according to the first embodiment is an electrified vehicle (BEV; Battery Electric Vehicle) that uses only the battery 32 as an electric power source. However, the vehicle 3 may be a so-called hybrid electric vehicle (HEV or a plug-in hybrid electric vehicle (PHEV)) that has an electric power source such as an internal combustion engine in addition to the battery 32, and the type is not particularly limited.

The vehicle side communication device 72 is configured to be able to communicate with the server 1 and the ground electric power supply device 2. In the first embodiment, the vehicle communication device accesses a wireless base station 7 (see FIG. 1) connected to the network 6 (see FIG. 1) via a gateway (not shown) or the like, in order to connect to the network 6 via the wireless base station 7. As a result, wireless communication is performed between the vehicle side communication device 72 and the server 1, and for example, various information necessary for receiving the non-contact electric power supply from the ground electric power supply device 2 is exchanged. At this time, the information is exchanged between the vehicle 3 and the ground electric power supply device 2 via the server 1.

Further, the vehicle side communication device 72 directly communicates with the ground side communication device 71 of each ground electric power supply device 2 by using a predetermined wireless communication line, and sends the above-mentioned approach signal to each ground electric power supply device 2.

The motor 31 is, for example, an AC synchronous motor, and functions as an electric motor and a generator. When the motor 31 functions as an electric motor, the motor 31 is driven by using the electric power stored in the battery 32 as an electric power source. The output of the motor 31 is transmitted to the wheels 30 via the reducer and the axle. On the other hand, when the vehicle 3 is decelerated, the motor 31 is driven by the rotation of the wheels 30, and the motor 31 functions as a generator to generate regenerative electric power.

The battery 32 is a rechargeable secondary battery, and is composed of, for example, a lithium ion battery, a nickel hydrogen battery, or the like. The battery 32 stores the electric power (for example, the driving power of the motor 31) required for the vehicle 3 to travel. When the electric power received by the electric power receiving device 5 is supplied from the electric power transmitting device 4, the battery 32 is charged. Further, when the regenerative electric power generated by the motor 31 is supplied to the battery 32, the battery 32 is charged. When the battery 32 is charged, the charge rate (SOC: state of charge) of the battery 32 is restored. The battery 32 may be charged by an external power source other than the ground electric power supply device 2 via the charging port provided in the vehicle 3.

The PCU 33 is electrically connected to the battery 32 and the motor 31. The PCU 33 has an inverter, a boost converter, and a DC/DC converter. The inverter converts the DC power supplied from the battery 32 into AC power, and supplies the AC power to the motor 31. On the other hand, the inverter converts the AC power (regenerated power) generated by the motor 31 into DC power, and supplies the DC power to the battery 32. The boost converter boosts the voltage of the battery 32 as needed when the electric power stored in the battery 32 is supplied to the motor 31. The DC/DC converter steps down the voltage of the battery 32 when the electric power stored in the battery 32 is supplied to an electronic device such as a headlight.

The electric power receiving device 5 receives power from the electric power transmitting device 4 and supplies the received electric power to the battery 32. The electric power receiving device 5 has an electric power receiving side resonance circuit 51, an electric power receiving side rectifier circuit 54, and a charging circuit 55.

The electric power receiving side resonance circuit 51 is arranged at the bottom of the vehicle 3 so that the distance from the road surface becomes short. The electric power receiving side resonance circuit 51 has the same configuration as the electric power transmitting side resonance circuit 43, and has a resonator composed of a coil 52 and a capacitor 53. Various parameters of the coil 52 and the capacitor 53 (outer diameter and inner diameter of the coil 52, number of turns of the coil 52, capacitance of the capacitor 53, and the like) are determined so that the resonance frequency of the electric power receiving side resonance circuit 51 matches the resonance frequency of the electric power transmitting side resonance circuit 43. If the amount of deviation between the resonance frequency of the electric power receiving side resonance circuit 51 and the resonance frequency of the electric power transmitting side resonance circuit 43 is small, for example, if the resonance frequency of the electric power receiving side resonance circuit 51 is within a range of ±20% of the resonance frequency of the electric power transmitting side resonance circuit 43, the resonance frequency of the electric power receiving side resonance circuit 51 does not necessarily have to match the resonance frequency of the electric power transmitting side resonance circuit 43.

When an AC magnetic field is generated by the electric power transmitting side resonance circuit 43 while the electric power receiving side resonance circuit 51 faces the electric power transmitting side resonance circuit 43, the vibration of the AC magnetic field is transmitted to the electric power receiving side resonance circuit 51 that resonates at the same resonance frequency as the electric power transmitting side resonance circuit 43. As a result, an induced current flows in the electric power receiving side resonance circuit 51 by electromagnetic induction, and an induced electromotive power is generated in the electric power receiving side resonance circuit 51 by the induced current. That is, the electric power transmitting side resonance circuit 43 transmits power to the electric power receiving side resonance circuit 51, and the electric power receiving side resonance circuit 51 receives power from the electric power transmitting side resonance circuit 43.

The electric power receiving side rectifier circuit 54 is electrically connected to the electric power receiving side resonance circuit 51 and the charging circuit 55. The electric power receiving side rectifier circuit 54 rectifies the AC power supplied from the electric power receiving side resonance circuit 51 and converts it into DC power, and supplies the DC power to the charging circuit 55. The electric power receiving side rectifier circuit 54 is, for example, an AC/DC converter.

The charging circuit 55 is electrically connected to the electric power receiving side rectifier circuit 54 and the battery 32. In particular, the charging circuit 55 is connected to the battery 32 via a relay 38. The charging circuit 55 converts the DC power supplied from the electric power receiving side rectifier circuit 54 into the voltage level of the battery 32 and supplies it to the battery 32. When the electric power transmitted from the electric power transmitting device 4 is supplied to the battery 32 by the electric power receiving device 5, the battery 32 is charged. The charging circuit 55 is, for example, a DC/DC converter.

The vehicle controller 34 performs various controls of the vehicle 3. For example, the vehicle controller 34 is electrically connected to the charging circuit 55 of the electric power receiving device 5 and controls the charging circuit 55 to control the charging of the battery 32 by the electric power transmitted from the electric power transmitting device 4. Further, the vehicle controller 34 is electrically connected to the PCU 33 and controls the PCU 33 to control the transfer of electric power between the battery 32 and the motor 31. Further, the vehicle controller 34 controls the vehicle side communication device 72.

Figure 4:
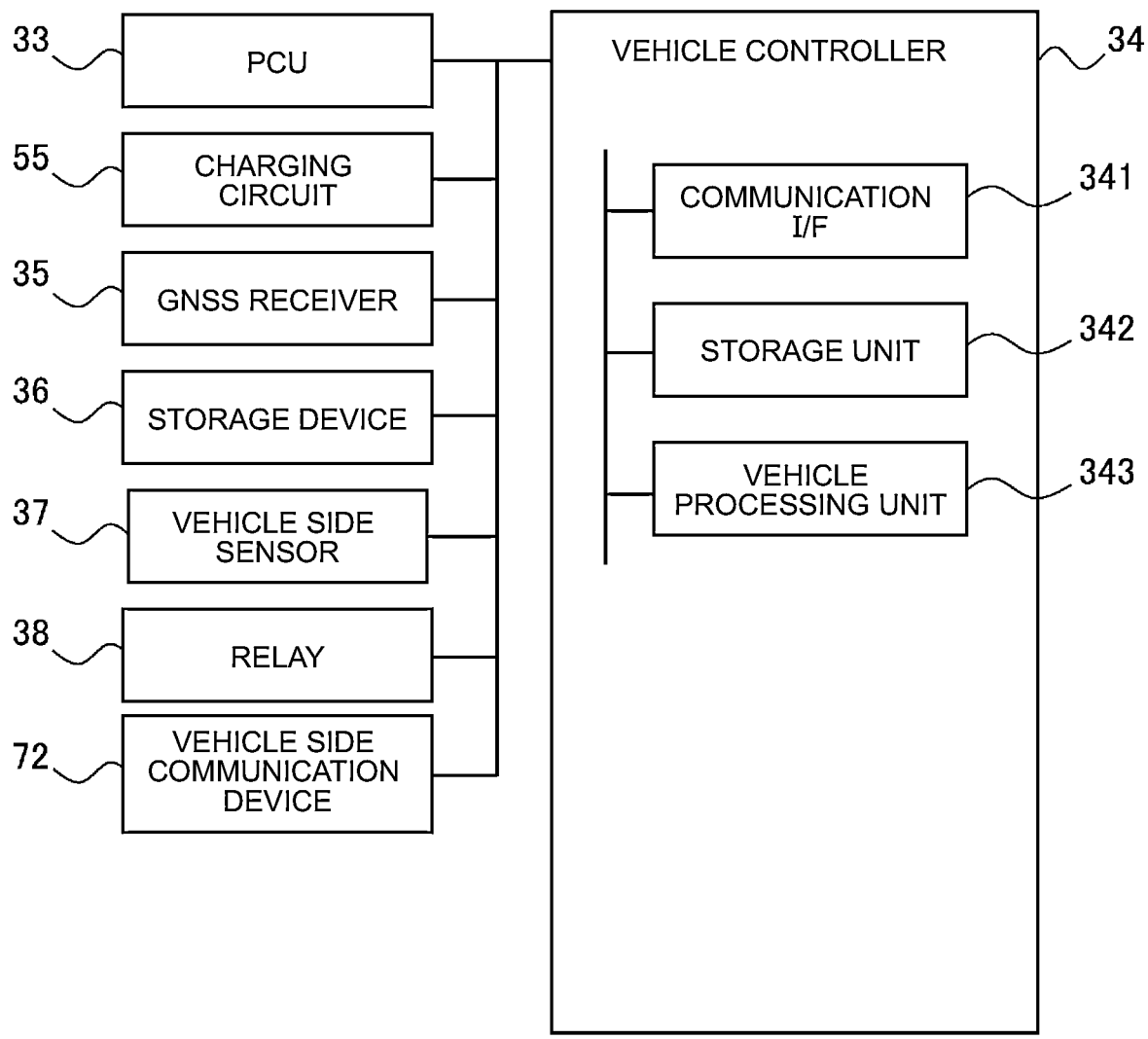
FIG. 4 is a schematic configuration diagram of the vehicle controller shown in FIG. 2 and equipment connected to the vehicle controller.

FIG. 4 is a schematic configuration diagram of the vehicle controller 34 and the equipment connected to the vehicle controller 34.

The vehicle controller 34 has a communication interface 341, a storage unit 342, and a vehicle processing unit 343. The communication interface 341, the storage unit 342, and the vehicle processing unit 343 are connected to each other via a signal line.

The communication interface 341 has an interface circuit for connecting the vehicle controller 34 to an in-vehicle network conforming to a standard such as a controller area network (CAN). The vehicle controller 34 communicates with other devices via the communication interface 341.

The storage unit 342 has a storage medium such as an HDD, an optical recording medium, and a semiconductor memory, and stores various computer programs, data, and the like used for processing in the vehicle processing unit 343.

The vehicle processing unit 343 has one or more CPUs and peripheral circuits thereof. The vehicle processing unit 343 executes various computer programs stored in the storage unit 342 and collectively controls the overall operation of the vehicle 3, and is, for example, a processor. When the vehicle processing unit 343 and the vehicle controller 34 detect that the vehicle 3 has approached the electrified road, for example, the vehicle processing unit 343 and the vehicle controller 34 start transmitting an approach signal via the vehicle side communication device 72, and controls the electric power receiving device 5 so that the vehicle 3 can receive electric power from the ground electric power supply device 2 when the vehicle 3 is traveling on the electrified road.

Further, the vehicle 3 further includes a GNSS receiver 35, a storage device 36, a plurality of vehicle side sensors 37, and the relay 38. The GNSS receiver 35, the storage device 36, the vehicle side sensor 37, and the relay 38 are electrically connected to the vehicle controller 34 via the in-vehicle network.

The GNSS receiver 35 detects the current position of the vehicle 3 (for example, the latitude and longitude of the vehicle 3) based on the positioning information obtained from multiple (for example, three or more) positioning satellites. The output of the GNSS receiver 35, that is, the current position of the vehicle 3 detected by the GNSS receiver 35 is transmitted to the vehicle controller 34.

The storage device 36 stores data. The storage device 36 includes, for example, an HDD, a solid state drive (SSD), or an optical recording medium. In the first embodiment, the storage device 36 stores map information. The map information includes information such as installation position information of the ground electric power supply device 2 in addition to information regarding the road. The vehicle controller 34 acquires the map information from the storage device 36. The storage device 36 does not have to include the map information. In this case, the vehicle controller 34 may acquire the map information from the outside (for example, the server 1) of the vehicle 3 via the vehicle side communication device 72.

The vehicle side sensor 37 detects the state of the vehicle 3. In the first embodiment, as sensors for detecting the state of the vehicle 3, the vehicle side sensor 37 includes a speed sensor that detects the speed of the vehicle 3, a battery temperature sensor that detects the temperature of the battery 32, an electric power receiving device temperature sensor that detects the temperature of the various devices (particularly, the electric power receiving side resonance circuit 51 and the electric power receiving side rectifier circuit 54) of the electric power receiving device 5, a battery current sensor that detects the charge current value and discharge current value of the battery 32, an electric power receiving device current sensor that detects the current flowing through the various devices of the electric power receiving device 5, and an electric power receiving device voltage sensor that detects the voltage applied to the various devices of the electric power receiving device 5. The output of the vehicle side sensor 37 is input to the vehicle controller 34.

The relay 38 is arranged between the battery 32 and the electric power receiving device 5, and connects and disconnects the battery 32 and the electric power receiving device 5. When the relay 38 is connected, the electric power received by the electric power receiving device 5 is supplied to the battery 32. However, when the relay 38 is disconnected, no current flows from the electric power receiving device 5 to the battery 32 and thus, the electric power receiving device 5 cannot substantially receive power.

By the way, for the purpose of electricity theft, the electric power receiving device 5 may be set on the ground electric power supply device 2 at midnight when it tends to be unnoticed, or the electric power receiving device 5 may be set on the ground electric power supply device 2 buried in a place that tends to be unnoticed. Further, for example, the coating of the coil 44 of the ground electric power supply device 2 may be damaged, and electricity leakage may occur from the ground electric power supply device 2. If electricity theft or electricity leakage occurs in the ground electric power supply device 2, it is desirable to be able to detect it at an early stage. However, increasing maintenance and inspection of the ground electric power supply device 2 by workers for early detection of electricity theft or electricity leakage is not practical. Electricity theft also includes performing electric power supply to a vehicle other than the vehicle 3.

Here, the time dependent mode change (hereinafter referred to as a "time dependent change pattern") of the electric power supply amount (or electric power supply efficiency) of the ground electric power supply device 2 in which electricity theft or electricity leakage is occurring is thought to be different from the time dependent change pattern of the electric power supply amount of the ground electric power supply device 2 in which electricity theft or electricity leakage has not occurred.

Figure 5:
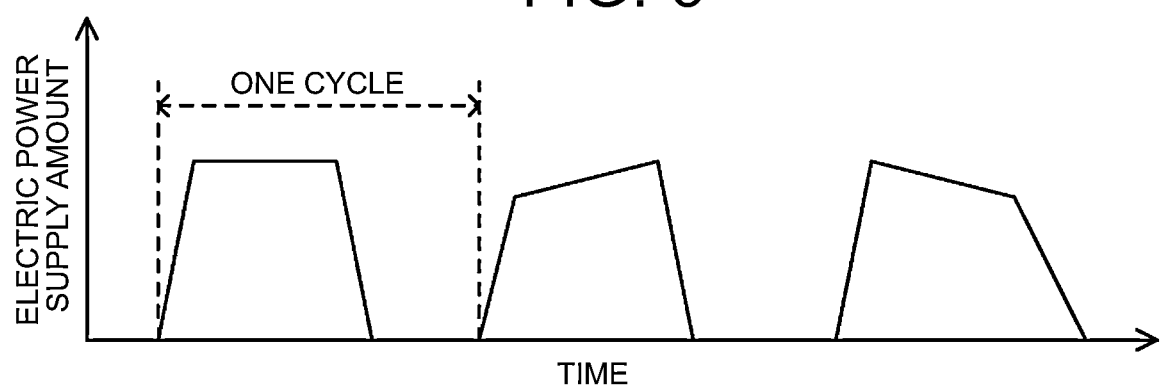
FIG. 5 is an example of a time dependent change pattern of an electric power supply amount of the ground electric power supply device when a plurality of vehicles continuously travel on a normal ground electric power supply device in which electricity theft or electricity leakage is not occurring.

FIG. 5 is an example of a time dependent change pattern of the electric power supply amount of the ground electric power supply device 2 when multiple (three, in the example shown in FIG. 5) vehicles 3 continuously travel on the normal ground electric power supply device 2 in which electricity theft or electricity leakage is not occurring.

Figure 6A:
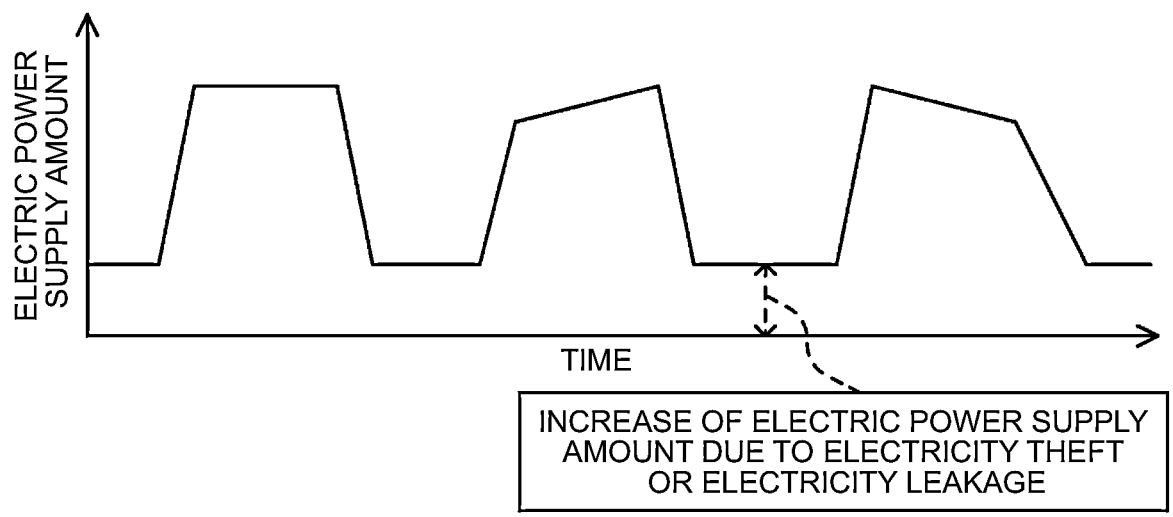
FIG. 6A shows an example of a time dependent change pattern of the electric power supply amount of the ground electric power supply device when the vehicles continuously travel on the ground electric power supply device in which electricity theft or electricity leakage is occurring.
Figure 6B:
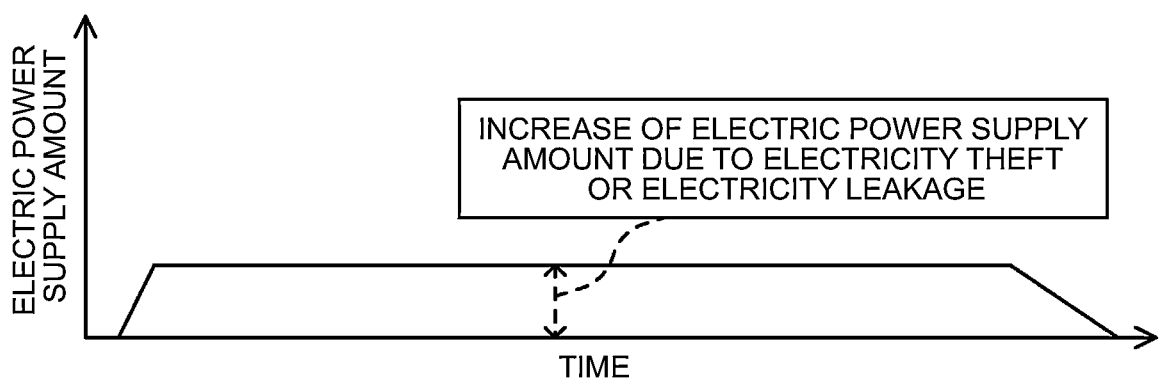
FIG. 6B is a diagram showing an example of a time dependent change pattern of the electric power supply amount of the ground electric power supply device when the vehicle is not traveling on the ground electric power supply device in which electricity theft or electricity leakage is occurring.

On the other hand, FIGS. 6A and 6B are diagrams showing examples of the time dependent change pattern of the electric power supply amount of the ground electric power supply device in which electricity theft or electricity leakage is occurring. Specifically, FIG. 6A shows an example of a time dependent change pattern when multiple (three, in the example shown in FIG. 6A) vehicles 3 continuously travel on the ground electric power supply device 2 in which electricity theft or electricity leakage is occurring. FIG. 6B is a diagram showing an example of the time dependent change pattern of the electric power supply amount of the ground electric power supply device 2 in which electricity theft or electricity leakage is occurring, when the vehicles 3 are not traveling.

The electric power supply to the vehicles 3 by the ground electric power supply device 2 is performed only while the vehicles 3 are traveling on the ground electric power supply device 2. Therefore, in the normal state where electricity theft or electricity leakage is not occurring in the ground electric power supply device 2, the electric power supply amount increases only when the vehicles 3 are traveling on the ground electric power supply device 2, and the electric power supply amount becomes zero (including values that can be regarded as zero) when the vehicles 3 are not traveling on the ground electric power supply device 2. That is, in the normal state where electricity theft or electricity leakage is not occurring in the ground electric power supply device 2, the electric power supply is basically interrupted.

Therefore, as shown in FIG. 5, the time dependent change pattern of the electric power supply amount of the ground electric power supply device 2 in the normal state basically becomes the time dependent change patter in which electric power supply is performed intermittently in a cycle corresponding to the vehicle speed of the vehicles 3 that travel over the ground electric power supply device 2.

In contrast, for example, when an electric power receiving device for electricity theft is installed on the ground electric power supply device 2, it is considered that electric power is basically continuously supplied to the electric power receiving device without interruption. In the case of electricity leakage, it is considered that the state is the same as when the electric power supply is continuously performed.

Thus, as shown in FIGS. 6A and 6B, the time dependent change pattern of the electric power supply amount of the ground electric power supply device 2 at the time of electricity theft or electricity leakage is basically the time dependent change pattern in which electric power supply is continuously performed.

Therefore, in the first embodiment, by using the fact that the time dependent change pattern of the electric power supply amount of the ground electric power supply device 2 is different at the normal time and at the time of electricity theft or electricity leakage, the occurrence of electricity theft or electricity leakage in the ground electric power supply device 2 is detected.

Specifically, in the first embodiment, as shown in FIG. 5, assuming that one cycle is from the start of electric power supply to the start of the next electric power supply, when the time during which the electric power supply amount is larger than zero (predetermined amount) is equal to or more than the predetermined time within that one cycle, it is determined that the electric power supply is being continuously performed and electricity theft or electricity leakage is occurring. Not limited to such a determination method, when the time during which the electric power supply amount is larger than zero (predetermined amount) is equal to or more than the predetermined time, it may be determined that the electric power supply is being continuously performed and electricity theft or electricity leakage is occurring.

Figure 7:
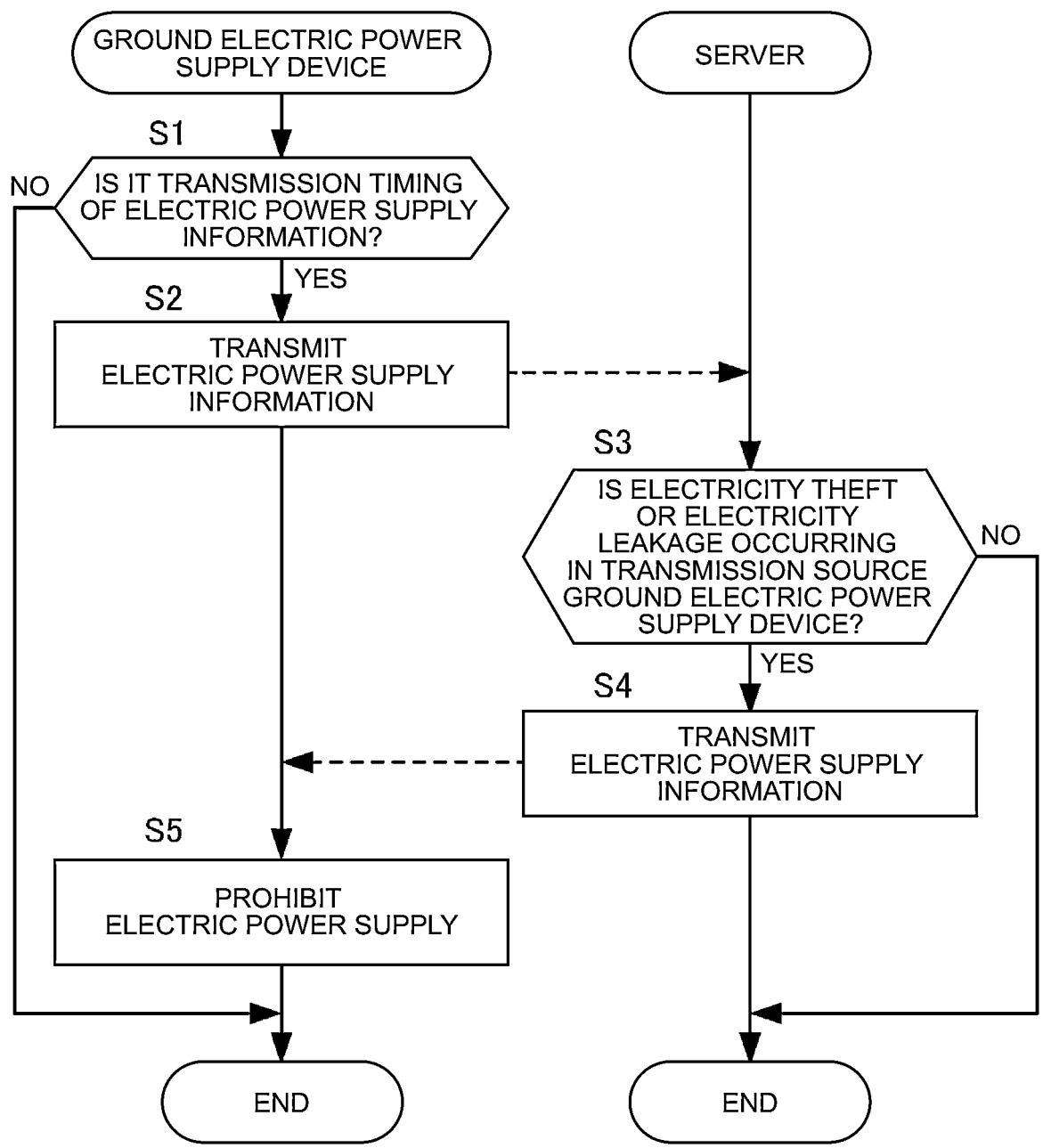
FIG. 7 is a flowchart for explaining about the content of a process by the abnormality detection device of a first embodiment of the present disclosure that is executed between each ground electric power supply device and a server in order to determine whether electricity theft or electricity leakage is occurring in each electric power supply device.

FIG. 7 is a flowchart for explaining about the content of a process by the first embodiment that is executed between each ground electric power supply device 2 and a server 1 in order to determine whether electricity theft or electricity leakage is occurring in each electric power supply device 2.

In step S1, the electric power transmitting controller 22 of the ground electric power supply device 2 determines whether it is the transmission timing of the electric power supply information. When a predetermined period has elapsed from the timing at which the electric power transmitting information was previously transmitted, the electric power transmitting controller 22 of the ground electric power supply device 2 determines that it is the transmission timing of the electric power supply information, and proceeds to the procedure of step S2. On the other hand, the electric power transmitting controller 22 of the ground electric power supply device 2 ends the current process when the predetermined period has not elapsed from the timing of the previous transmission of the electric power supply information.

The electric power supply information includes, for example, the ID information set for each ground electric power supply device 2, pattern information regarding the time dependent change pattern of the electric power supply amount of the ground electric power supply device 2 within a predetermined period, and installation position information regarding the installation position of the ground electric power supply device 2.

In step S2, the electric power transmitting controller 22 of the ground electric power supply device 2 transmits the electric power supply information to the server 1.

In step S3, based on the pattern information in the received electric power supply information, the server 1 determines whether electricity theft or electricity leakage is occurring in the ground electric power supply device 2 that has transmitted the electric power supply information (that is, the ground electric power supply device 2 that transmitted the electric power supply information in step S2, hereinafter referred to as the "transmission source ground electric power supply device 2" when necessary).

In the first embodiment, when the server 1 can determine that the electric power supply is continuously performed based on the time dependent change pattern of the transmission source ground electric power supply device 2 (in other words, when it can be determined that the electric power supply is not periodically performed), it is determined that electricity theft or electricity leakage is occurring in the ground electric power supply device 2. Specifically, assuming that one cycle is from the start of electric power supply to the start of the next electric power supply, the server 1 determines that the electric power supply is being continuously performed and electricity theft or electricity leakage is occurring, when the time during which the electric power supply amount is larger than a predetermined amount (zero or values that can be regarded as zero) is equal to or more than the predetermined time within that one cycle.

It is desirable that this predetermined time can be changed based on, for example, at least one of the congestion degree and the traffic jam degree of the road on which the transmission source ground electric power supply device 2 is installed. Hereinafter, the reason will be described with reference to FIGS. 8 and 9.

Figure 8:
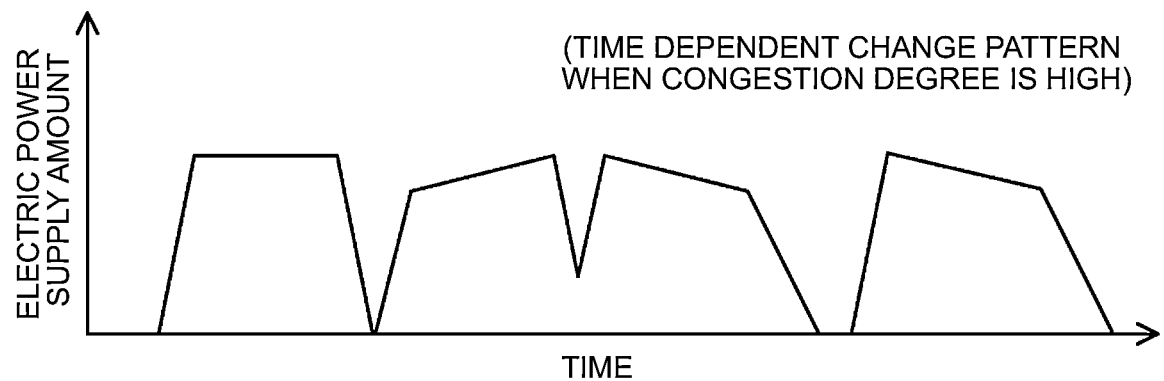
FIG. 8 is a diagram showing an example of a time dependent change pattern when electricity theft or electricity leakage has not occurred in the ground electric power supply device and the congestion degree of the road on which the ground electric power supply device 2 is installed is high.

FIG. 8 is a diagram showing an example of a time dependent change pattern when electricity theft or electricity leakage has not occurred in the ground electric power supply device 2 and the congestion degree of the road on which the ground electric power supply device 2 is installed is high.

When the congestion degree of the road on which the ground electric power supply device 2 is installed is high, that is, when the number of vehicles 3 passing through the road per predetermined time is large, the inter-vehicle distance between vehicles may be shortened. As a result, the interval from the end of the electric power supply to the start of the next electric power supply becomes short, the end timing and the start timing of the electric power supply become unclear as shown in FIG. 8, the time dependent change pattern is such that the electric power is being continuously supplied even though electricity theft or electricity leakage in the ground electric power supply device 2 is not occurring, and it may be difficult to determine whether electric power supply is being performed continuously or intermittently.

Therefore, it is preferable to determine whether electricity theft or electricity leakage is occurring in the ground electric power supply device 2 in consideration of the congestion degree of the road on which the ground electric power supply device 2 is installed. For example, when the congestion degree of the road is high, the predetermined time can be longer than, for example, when it is low. As a result, when the electric power supply becomes continuous as the distance between vehicles becomes shorter, it is possible to suppress a determination error of determining that electricity theft or electricity leakage is occurring.

Figure 9:
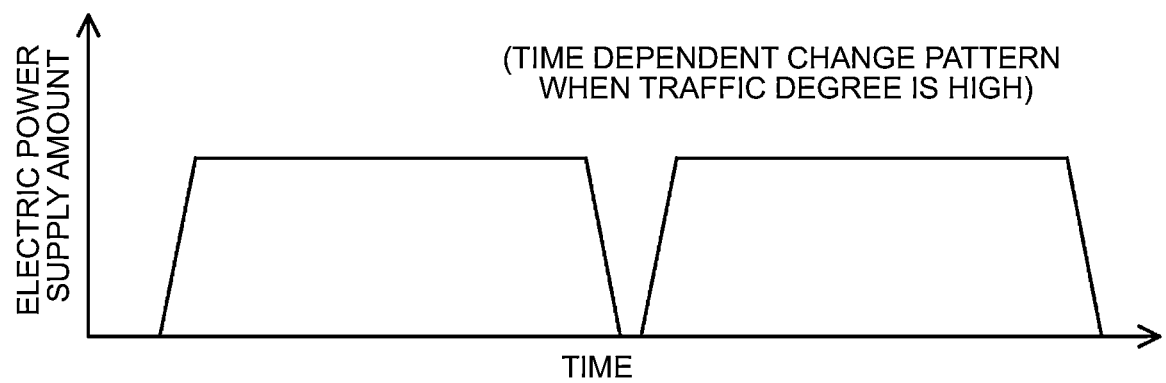
FIG. 9 is a diagram showing an example of a time dependent change pattern when electricity theft or electricity leakage has not occurred in the ground electric power supply device and the traffic jam degree of the road on which the ground electric power supply device is installed is high.

FIG. 9 is a diagram showing an example of a time dependent change pattern when electricity theft or electricity leakage has not occurred in the ground electric power supply device 2 and the traffic jam degree of the road on which the ground electric power supply device 2 is installed is high.

As shown in FIG. 9, the higher the traffic jam degree of the road on which the ground electric power supply device 2 is installed, that is, the slower the traveling speed of the vehicle 3 passing through the road, the longer it takes for the vehicle 3 to pass through the ground electric power supply device 2 and thus, the electric power supply time also becomes long. Therefore, there is a possibility of a determination error in which it is determined that the electric power is being continuously supplied even though electricity theft or electricity leakage in the ground electric power supply device 2 is not occurring.

Therefore, it is preferable that the determination of whether electricity theft or electricity leakage is occurring in the ground electric power supply device 2 is performed in consideration of the traffic jam degree of the road on which the ground electric power supply device 2 is installed. For example, when the traffic jam degree of the road is high, the predetermined time can be longer than when it is low, for example. As a result, when the electric power supply becomes continuous due to the traffic jam, it is possible to suppress a determination error of determining that electricity theft or electricity leakage is occurring.

As for the congestion degree and the traffic jam degree of the road on which the ground electric power supply device 2 is installed, the actual congestion degree and the traffic jam degree can be acquired from, for example, an external road traffic information center. Further, when such information cannot be acquired in real time, for example, the current congestion degree and traffic jam degree may be estimated from the congestion degree and traffic jam degree in the same time zone in the past.

Returning to FIG. 7, in step S4, the server 1 transmits an electric power supply prohibition signal to the transmission source ground electric power supply device 2. At this time, with the position information of the transmission source ground electric power supply device 2, the occurrence of electricity theft or electricity leakage in the transmission source ground electric power supply device 2 may be notified to an external related organization (for example, a maintenance company of the ground electric power supply device 2 or a public institution such as the police).

In step S5, when the electric power transmitting controller 22 of the ground electric power supply device 2 receives the electric power supply prohibition signal, the electric power supply to the vehicle 3 is prohibited, for example, by completely cutting the electric power supply from the electric power source 21 to the electric power transmitting device 4.

The server 1 that is the abnormality detection device according to the first embodiment described above includes the server processing unit 13 (processing unit) and the server communication unit 11 (communication unit) that can communicate with the ground electric power supply device 2 that transmits electric power to the vehicle 3 in a non-contact manner. Then, the server processing unit 13 is configured to detect electricity theft or electricity leakage in the ground electric power supply device 2 based on the time dependent change pattern that is a time dependent change mode of the electric power supply amount of the ground electric power supply device 2.

Specifically, in the first embodiment, the server processing unit 13 is configured to determine that electricity theft or electricity leakage is occurring in the ground electric power supply device 2 when determination is made that the electric power supply is continuously performed based on the time dependent change pattern of the ground electric power supply device 2 (in other words, when determination is made that the electric power supply is not periodically performed). On the other hand, the server processing unit 13 is configured to determine that no electricity theft or electricity leakage is occurring in the ground electric power supply device 2, when it is determined that the electric power supply is being performed intermittently. In particular, in the first embodiment, the server processing unit 13 is configured to determine that electricity theft or electricity leakage is occurring in the ground electric power supply device 2, when the time during which the electric power supply amount of the ground electric power supply device 2 is larger than zero or a predetermined amount that can be regarded as zero is a predetermined time or more.

Therefore, by using the fact that the time dependent change pattern of the electric power supply amount of the ground electric power supply device 2 is different at the normal time and at the time of electricity theft or electricity leakage, it is possible to detect the ground electric power supply device 2 in which electricity theft or electricity leakage is suspected to have occurred.

Further, in the first embodiment, the server processing unit 13 is configured so as to take into consideration at least one of the congestion degree and the traffic jam degree of the road on which the ground electric power supply device 2 is installed, when the time dependent change pattern of the ground electric power supply device 2 is acquired, at the time of determining whether the electric power supply is continuously or periodically performed. The congestion degree is set based on the number of vehicles 3 passing through the road per predetermined time, and the traffic jam degree is set based on the traveling speed of the vehicles 3 passing through the road.

By taking the congestion degree into consideration, when the electric power supply becomes continuous as the distance between vehicles becomes shorter, it is possible to suppress a determination error of determining that electricity theft or electricity leakage is occurring. In addition, by taking the traffic jam degree into consideration, when the electric power supply time to one vehicle 3 becomes long due to the traffic jam and the electric power supply becomes continuous, it is possible to suppress a determination error of determining that electricity theft or electricity leakage is occurring.

Further, in the first embodiment, the server processing unit 13 is configured such that when the server processing unit 13 determines that electricity theft or electricity leakage is occurring in the ground electric power supply device 2, the server processing unit 13 commands prohibition of electric power supply to the ground electric power supply device 2 via the server communication unit 11. This makes it possible to prevent electricity theft or electricity leakage after the prohibition instruction.

Further, the server communication unit 11 is configured to be able to communicate with an external related organization. The server processing unit 13 is configured such that when the server processing unit 13 determines that electricity theft or electricity leakage is occurring in the ground electric power supply device 2, the server processing unit 13 notifies the external related organization that electricity theft or electricity leakage is occurring in the ground electric power supply device 2 via the server communication unit 11. As a result, when electricity theft or electricity leakage occurs, appropriate follow-up measures can be taken.

Next, the abnormality detection device according to the second embodiment of the present disclosure will be described. The second embodiment is different from the first embodiment in the method of detecting electricity theft or electricity leakage. The differences will be described below.

In the first embodiment described above, the occurrence of electricity theft or electricity leakage is detected by utilizing the fact that the time dependent change pattern of the electric power supply amount of the ground electric power supply device 2 at the time of electricity theft or electricity leakage is basically a continuous time dependent change pattern.

However, for example, it is conceivable to configure an electric power receiving device for electricity theft so that electric power supply can be received intermittently. In some cases, electricity leakage may occur intermittently.

Figure 10:
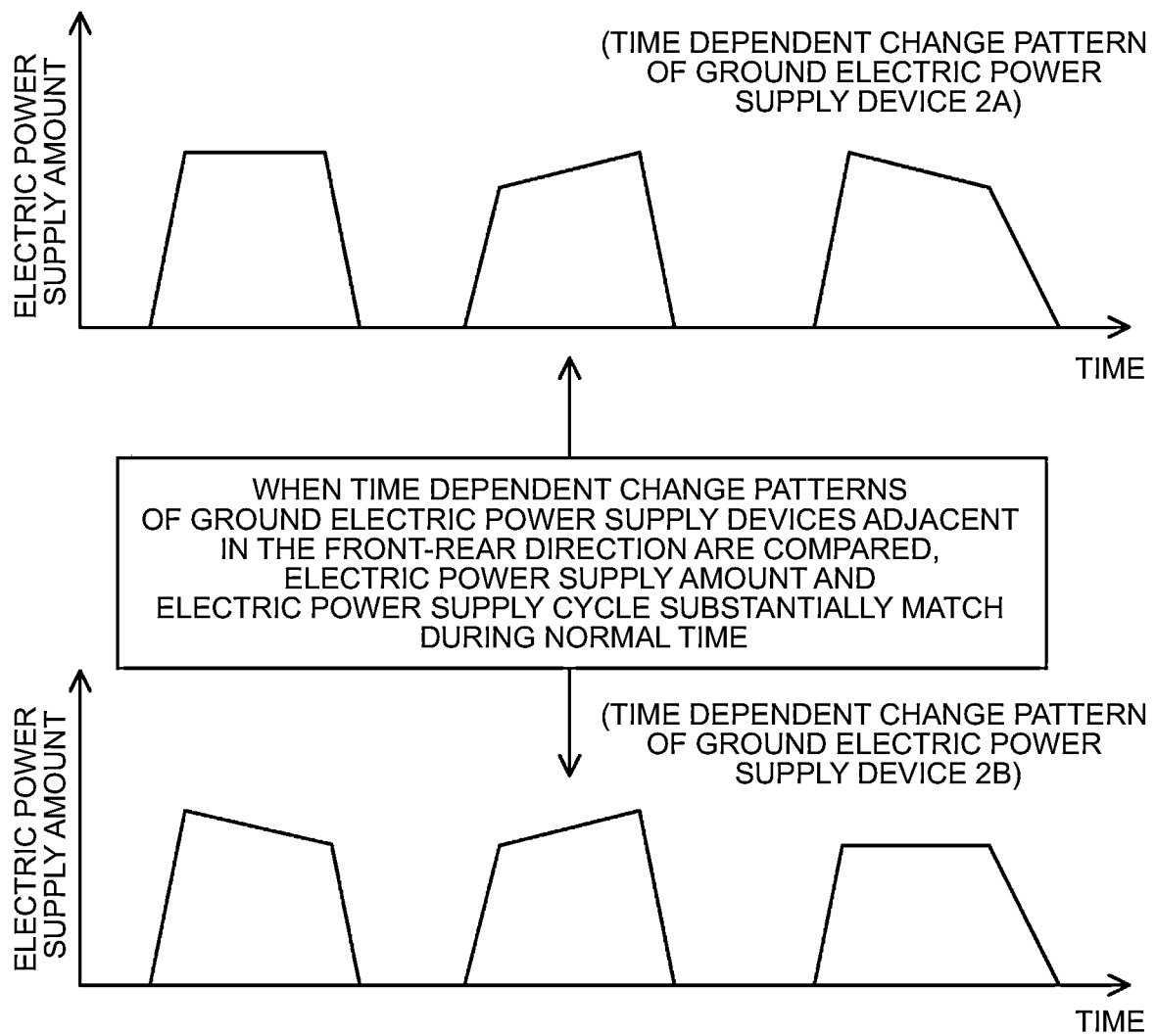
FIG. 10 shows an example of a time dependent change pattern of the electric power supply amount of each of the two adjacent ground electric power supply devices among the ground electric power supply devices arranged continuously along traveling lane when the two adjacent ground electric power supply devices are normal.

Here, FIG. 10 shows an example of a time dependent change pattern of the electric power supply amount of each of the two adjacent ground electric power supply devices 2 among the ground electric power supply devices 2 arranged continuously along traveling lane when the two adjacent ground electric power supply devices are normal (that is, when electricity theft or electricity leakage is not occurring in either ground electric power supply device 2). In the following description, in order to prevent the explanation from being complicated and to facilitate the understanding of the disclosure, when it is particularly necessary to distinguish between them, among the two adjacent ground electric power supply devices 2, one ground electric power supply device 2 is referred to as a "ground electric power supply device 2A" is and the other ground electric power supply device 2 is referred to as a "ground electric power supply device 2B".

FIG. 10 shows a time dependent change pattern of the electric power supply amount when three vehicles 3 continuously travel on both ground electric power supply devices 2A and 2B. At this time, when the ground electric power supply devices 2A and 2B are normal, the two time dependent change patterns are almost the same pattern. That is, the electric power supply amount to each vehicle 3 are substantially the same for the ground electric power supply devices 2A and 2B, and the traveling speed and inter-vehicle distance of each vehicle 3 while traveling in the section where the ground electric power supply devices 2A and 2B are installed are considered basically not to change. Thus, the electric power supply cycle is substantially the same.

On the other hand, FIGS. 11A to 11D show examples of the time dependent change pattern of the electric power supply amount when the ground electric power supply device 2A is normal but electricity theft or electricity leakage is occurring in the ground electric power supply device 2B.

Figure 11A:
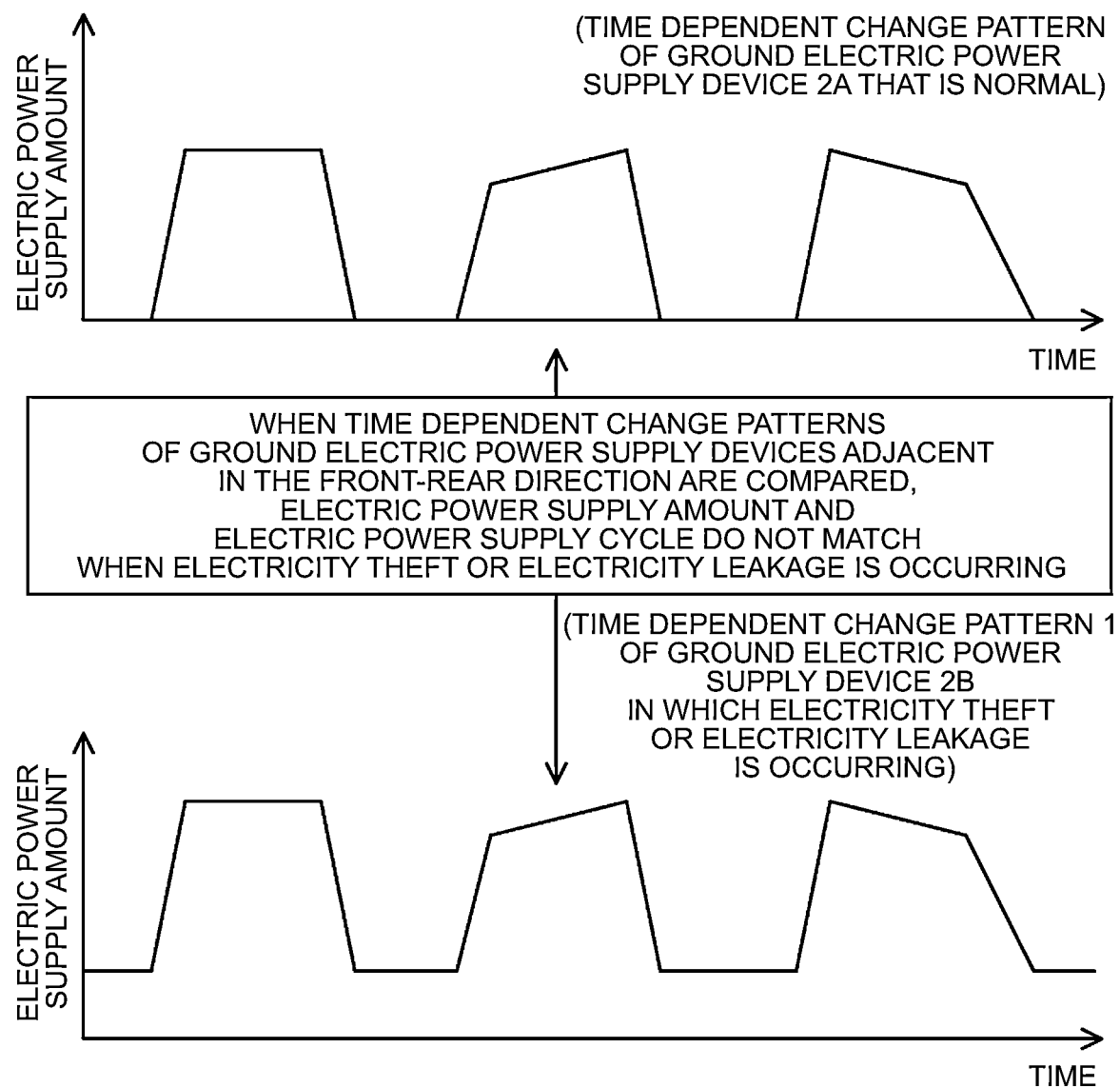
FIG. 11A shows an example of a time dependent change pattern of the electric power supply amount of the normal ground electric power supply device and an example of a time dependent change pattern of the electric power supply amount of the ground electric power supply device in which electricity theft or electricity leakage is occurring.
Figure 11C:
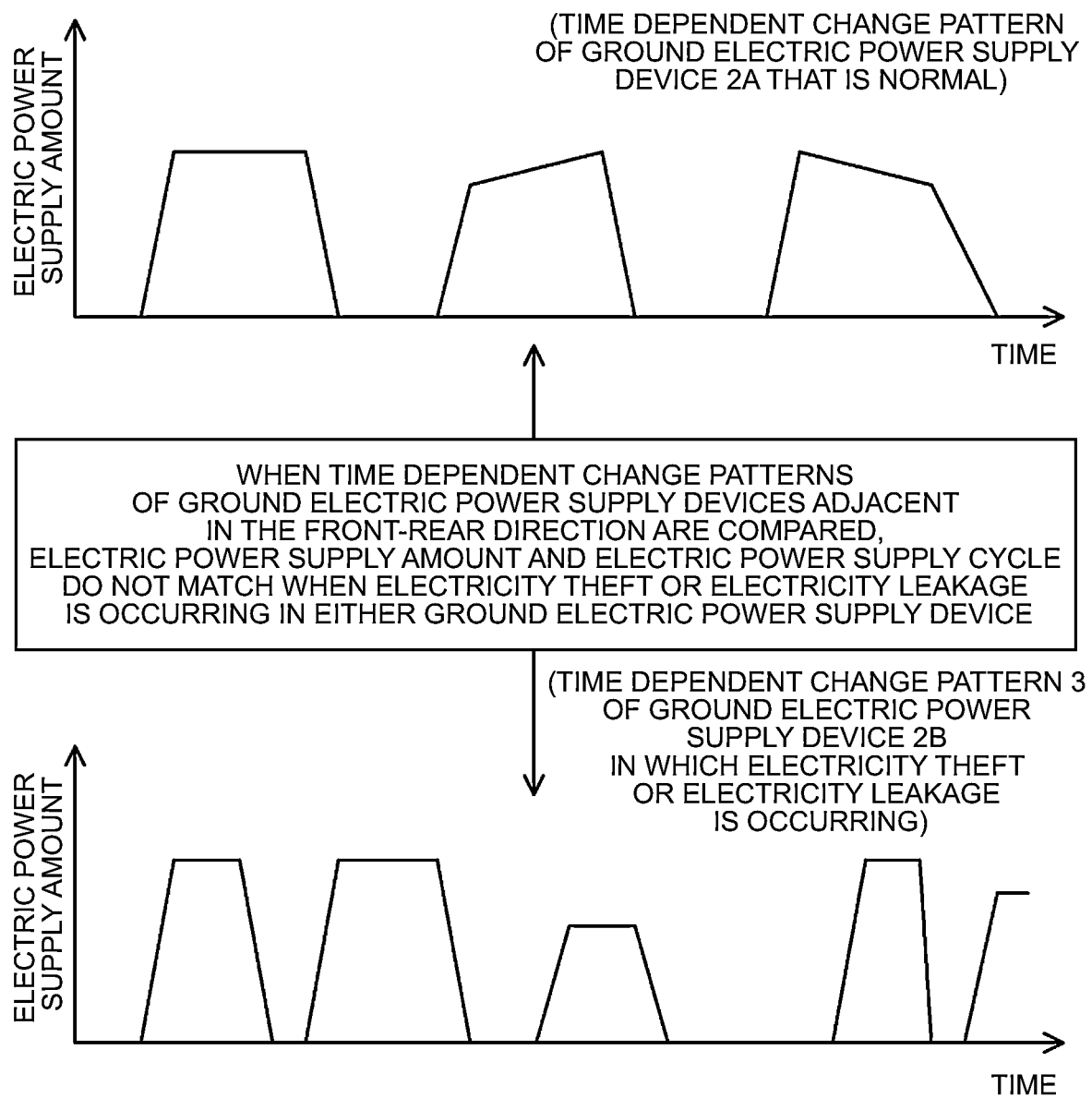
FIG. 11C shows an example of a time dependent change pattern of the electric power supply amount of the normal ground electric power supply device and an example of a time dependent change pattern of the electric power supply amount of the ground electric power supply device in which electricity theft or electricity leakage is occurring.

In FIGS. 11A and 11B, as in the first embodiment, the time dependent change pattern of the electric power supply amount of the ground electric power supply device 2B in which electricity theft or electricity leakage occurs is a time dependent change pattern in which electric power supply is continuously performed. On the other hand, in FIGS. 11C and 11D, the time dependent change pattern of the electric power supply amount of the ground electric power supply device 2B in which electricity theft or electricity leakage occurs is a time dependent change pattern in which electric power supply is intermittently performed. However, when compared with the time dependent change pattern of the electric power supply amount of the adjacent normal ground electric power supply device 2A, it can be seen that the electric power supply cycle is different in FIG. 11C as compared with the normal case. Further, in FIG. 11D, it can be seen that the peak value of the electric power supply amount is larger than that of the normal case. In the case of electricity theft for the purpose of stealing power, the peak value of the electric power supply amount tends to be relatively large in this way.

In this way, even if the electric power receiving device for electricity theft is configured to be able to receive electric power supply intermittently, it is difficult to align the electric power supply amount and the electric power supply cycle with the neighboring ground electric power supply device 2, and even in the case of electricity leakage, it is considered that the electric power supply amount and the electric power supply cycle are different from those of the neighboring ground electric power supply device 2.

Therefore, in the second embodiment, it is decided that, by comparing the time dependent change pattern of the electric power supply amount of the ground electric power supply device 2 that is a detection target of electricity theft or electricity leakage and the time dependent change pattern of the electric power supply amount of one or multiple neighboring ground electric power supply devices 2 arranged in a range close to a certain degree such as two ground electric power supply devices 2 adjacent in front-rear direction, whether electricity theft or electricity leakage is occurring in the ground electric power supply device 2 that is the detection target is determined.

An example of the neighboring ground electric power supply device 2 arranged in a range that is close to a certain degree is the ground electric power supply device 2 arranged at a place that has a high possibility that the vehicle 3 that has traveled on the ground electric power supply device 2 that is the detection target of electricity theft or electricity leakage travels, such as the ground electric power supply device 2 arranged on the same traveling lane as the ground electric power supply device 2 that is the detection target of electricity theft or electricity leakage, other than the ground electric power supply device 2 adjacent to the ground electric power supply device 2 that is the detection target of electricity theft or electricity leakage.

Figure 12:
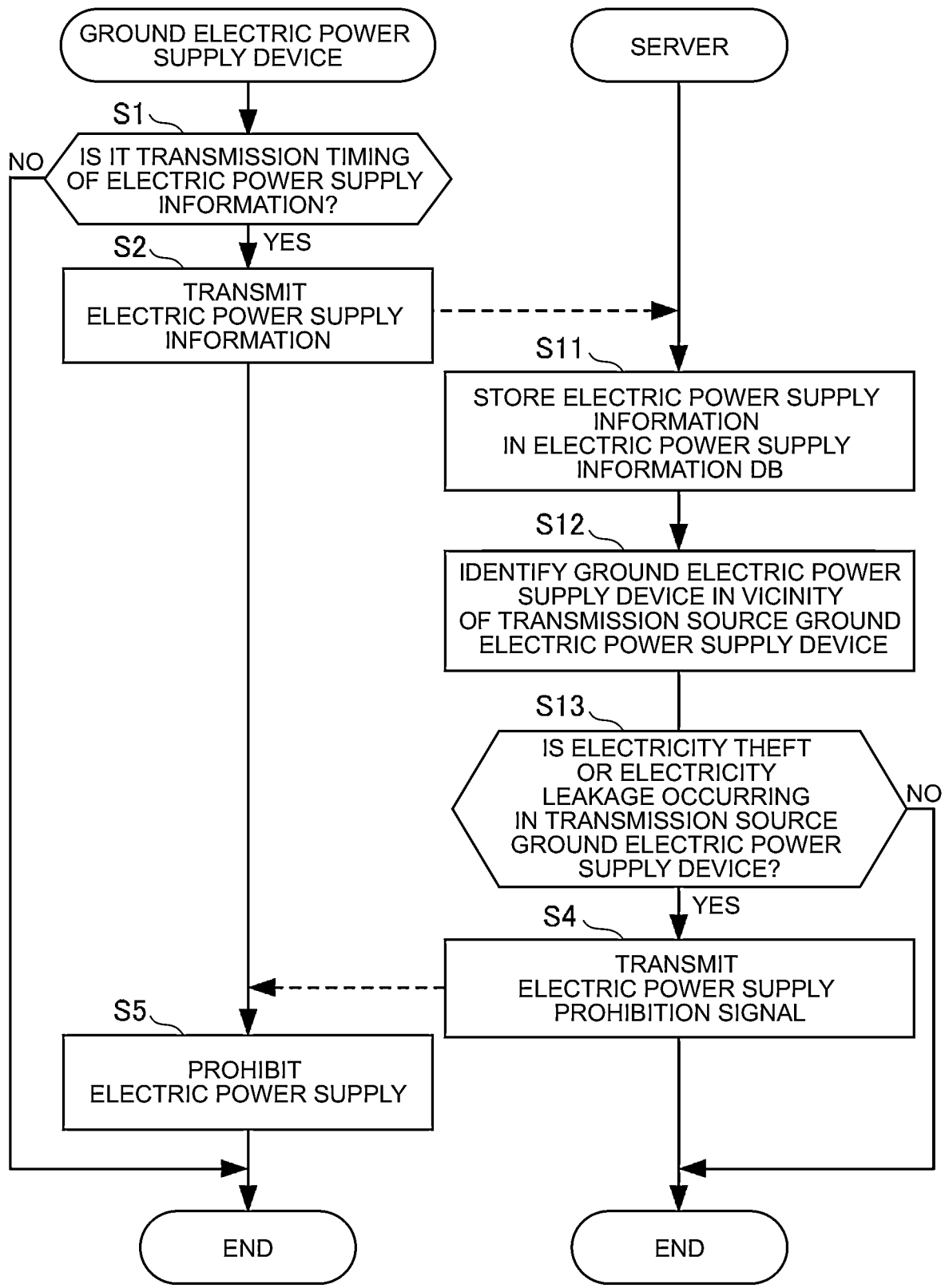
FIG. 12 is a flowchart for explaining about the content of a process by the abnormality detection device of a second embodiment of the present disclosure that is executed between each ground electric power supply device and a server in order to determine whether electricity theft or electricity leakage is occurring in each power supply device.

FIG. 12 is a flowchart illustrating the content of the process according to the second embodiment executed between each ground electric power supply device 2 and the server in order to detect the occurrence of electricity theft or electricity leakage in each ground electric power supply device 2. In FIG. 12, the contents of the processes of steps S1, S2, S4, and S5 are the same as those of the first embodiment, and thus the description thereof will be omitted here.

In step S11, the server 1 stores the received electric power supply information in the electric power supply information database in the server storage unit 12. In this way, the electric power supply information of each ground electric power supply device 2 is aggregated in the server 1, and the aggregated power supply information of each ground electric power supply device 2 is stored in the electric power supply information database.

In step S12, the server 1 refers to the electric power supply information database, and identifies the ground electric power supply device 2 that is installed in the vicinity of the transmission source ground electric power supply device 2 that transmits the electric power supply information, based on the installation position information in the electric power supply information received in step S3. In the second embodiment, the server 1 identifies the two adjacent ground electric power supply devices 2 in front of and behind the transmission source ground electric power supply device 2.

In step S13, the server 1 acquires the time dependent change pattern of the electric power supply amount of each ground electric power supply device 2 specified in step S12 from the electric power supply information database, and by comparing these time dependent change patterns with the time dependent change pattern of the electric power supply amount of the transmission source ground electric power supply device 2, whether electricity theft or electricity leakage is occurring in the transmission source ground electric power supply device 2 is determined.

The server 1 that is the abnormality detection device according to the second embodiment described above includes the server processing unit 13, the server communication unit 11 that can communicate with the multiple ground electric power supply devices 2 that transmits electric power to the vehicle 3 in a non-contact manner, and the server storage unit 12 that at least stores information about the time dependent change pattern of the ground electric power supply devices 2. Then, the server processing unit 13 is configured to detect electricity theft or electricity leakage of one ground electric power supply device 2 among the plurality of ground electric power supply devices 2 (hereinafter, the one ground electric power supply device is referred to as the "first ground electric power supply device"), based on the time dependent change pattern of the first ground electric power supply device 2 that is received from one ground electric power supply device 2 via server the communication unit 11 and the time dependent change pattern of a second ground electric power supply device 2 stored in the server storage unit 12. The second ground electric power supply device 2 may be, for example, at least one ground electric power supply device installed in the vicinity of the first ground electric power supply device 2.

In this way, by comparing the time dependent change patterns of the ground electric power supply devices 2, it is possible to accurately determine whether electricity theft or electricity leakage is occurring in the ground electric power supply device 2. For example, even if the time dependent change pattern of the ground electric power supply device 2 in which electricity theft or electricity leakage occurs is intermittent, it is possible to accurately determine whether electricity theft or electricity leakage is occurring in the ground electric power supply device 2.

Although the first embodiment and the second embodiment of the present disclosure have been described above, the first embodiment and the second embodiment are only a part of the application examples of the present disclosure, and the technical aspects of the present disclosure are not intended to be limited to the specific configuration of the above embodiment.

For example, in the above-mentioned first embodiment and second embodiment, it is determined whether electricity theft or electricity leakage is occurring in the ground electric power supply device 2 based on the time dependent change mode of the electric power supply amount of the ground electric power supply device 2. However, electricity theft or electricity leakage may occur in the ground electric power supply device 2 based on a time dependent change mode of a parameter that correlates with the electric power supply amount, such as the electric power supply efficiency (transmitting efficiency). That is, electricity theft or electricity leakage of the ground electric power supply device 2 may be detected based on the time dependent change pattern that is the time dependent change mode of the electric power supply amount of the ground electric power supply device 2 or the parameter correlated with the electric power supply amount of the ground electric power supply device 2.

Further, in the above-mentioned first embodiment and second embodiment, it is determined by the server 1 whether electricity theft or electricity leakage is occurring. However, it can also be determined by the ground electric power supply device 2. For example, in the case of the second embodiment, time dependent change patterns may be set to be able to be compared with each other by allowing mutual communication of the pattern information between the adjacent ground electric power supply devices 2.

Further, in the first embodiment and the second embodiment described above, after it is determined that electricity theft or electricity leakage is occurring in the ground electric power supply device 2, it may be further determined whether electricity theft is occurring or electricity leakage is occurring. In general, electricity theft for the purpose of stealing electric power tends to have a relatively high peak value of the electric power supply amount (the value at which the electric power supply amount is the highest in one cycle of the time dependent change pattern). On the other hand, in the case of electricity leakage, the peak value of the electric power supply amount tends to be relatively low. Thus, after determining that electricity theft or electricity leakage is occurring in the ground electric power supply device 2, it may be determined whether electricity theft is occurring or electricity leakage is occurring according to the value of the peak value in one cycle. That is, when the time during which the electric power supply amount of the ground electric power supply device 2 is larger than zero or a predetermined amount that can be regarded as zero is a predetermined time or more, it may be determined that electricity theft is occurring in the ground electric power supply device 2 when the peak value of the electric power supply amount is a predetermined value or more, and when the peak value of the electric power supply amount is less than a predetermined value, it may be determined that electricity leakage is occurring in the ground electric power supply device 2.

What is claimed is:

1. An abnormality detection device comprising:
    a processing unit;
    a communication unit that is configured to be able to communicate with a ground electric power supply device that transmits electric power to a vehicle in a non-contact manner;
    wherein the processing unit is configured to detect electricity theft or electricity leakage in the ground electric power supply device, based on a time dependent change pattern of an electric power supply amount of the ground electric power supply device or a parameter that is correlated to the electric power supply amount, the time dependent change pattern being a time dependent change mode,
    the processing unit is configured to determine that electricity theft or electricity leakage is occurring in the ground electric power supply device when the processing unit determines that an electric power supply is continuously performed based on the time dependent change pattern of the ground electric power supply device, and
    the processing unit is configured to take into consideration, at least one of a congestion degree or a traffic jam degree of a road on which the ground electric power supply device is installed, when the time dependent change pattern of the ground electric power supply device is acquired, at a time of determining whether the electric power supply is continuously or periodically performed.

2. The abnormality detection device according to claim 1, wherein:
    the congestion degree is set based on the number of vehicles passing through the road per predetermined time; and
    the traffic jam degree is set based on a traveling speed of the vehicle passing through the road.

3. The abnormality detection device according to claim 1, wherein the processing unit is configured to determine that electricity theft or electricity leakage is occurring in the ground electric power supply device when the processing unit determines that an electric power supply is not periodically performed, based on the time dependent change pattern of the ground electric power supply device.

4. The abnormality detection device according to claim 3, wherein the processing unit is configured to take into consideration, at least one of a congestion degree and a traffic jam degree of a road on which the ground electric power supply device is installed, when the time dependent change pattern of the ground electric power supply device is acquired, at a time of determining whether the electric power supply is continuously or periodically performed.

5. The abnormality detection device according to claim 4, wherein:
the congestion degree is set based on the number of vehicles passing through the road per predetermined time; and
the traffic jam degree is set based on a traveling speed of the vehicle passing through the road.

6. The abnormality detection device according to claim 1, wherein the processing unit is configured to determine that electricity theft or electricity leakage is not occurring in the ground electric power supply device when the processing unit determines that an electric power supply is intermittently performed, based on the time dependent change pattern of the ground electric power supply device.

7. The abnormality detection device according to claim 1, wherein the processing unit is configured to determine that electricity theft or electricity leakage is occurring in the ground electric power supply device when the time during which the electric power supply amount of the ground electric power supply device is larger than zero or a predetermined amount that is able to be regarded as zero is a predetermined time or more.

8. The abnormality detection device according to claim 7, wherein the predetermined time is set in consideration of at least one of a congestion degree and a traffic jam degree of a road on which the ground electric power supply device is installed.

9. The abnormality detection device according to claim 8, wherein:
the congestion degree is set based on the number of vehicles passing through the road per predetermined time; and
the traffic jam degree is set based on a traveling speed of the vehicle passing through the road.

10. The abnormality detection device according to claim 1, wherein the processing unit is configured to, when the time during which the electric power supply amount of the ground electric power supply device is larger than zero or a predetermined amount that is able to be regarded as zero is a predetermined time or more, determine that electricity theft is occurring in the ground electric power supply device when a peak value of the electric power supply amount is a predetermined value or more, and the processing unit is configured to determine that electricity leakage is occurring in the ground electric power supply device when the peak value of the electric power supply amount is less than the predetermined value.

11. The abnormality detection device according to claim 1, wherein the processing unit is configured such that when the processing unit determines that electricity theft or electricity leakage is occurring in the ground electric power supply device, the processing unit commands prohibition of an electric power supply to the ground electric power supply device via the communication unit.

12. The abnormality detection device according to claim 1, wherein:
the communication unit is configured to be able to communicate with an external related organization; and
the processing unit is configured such that when the processing unit determines that electricity theft or electricity leakage is occurring in the ground electric power supply device, the processing unit notifies the external related organization via the communication unit that electricity theft or electricity leakage in the ground electric power supply device is occurring.

13. The abnormality detection device according to claim 1 further comprising a storage unit that is configured to at least store information regarding the time dependent change pattern of a plurality of the ground electric power supply devices,
wherein the processing unit is configured to detect electricity theft or electricity leakage of a first ground electric power supply device that is one ground electric power supply device among the ground electric power supply devices, based on the time dependent change pattern of the first ground electric power supply device that is received from the first ground electric power supply device via the communication unit and the time dependent change pattern of a second ground electric power supply device stored in the storage unit.

14. The abnormality detection device according to claim 13, wherein the second ground electric power supply device is at least one ground electric power supply device that is installed in a vicinity of the first ground electric power supply device.

15. An abnormality detection method of an abnormality detection device, the abnormality detection device including a processing unit and a communication unit that is configured to be able to communicate with a ground electric power supply device that transmits electric power to a vehicle in a non-contact manner, the abnormality detection method comprising
detecting electricity theft or electricity leakage in the ground electric power supply device, based on a time dependent change pattern of an electric power supply amount of the ground electric power supply device or a parameter that is correlated to the electric power supply amount, the time dependent change pattern being a time dependent change mode;
determining that electricity theft or electricity leakage is occurring in the ground electric power supply device when the processing unit determines that an electric power supply is continuously performed based on the time dependent change pattern of the ground electric power supply device; and
taking into consideration, at least one of a congestion degree or a traffic jam degree of a road on which the ground electric power supply device is installed, when the time dependent change pattern of the ground electric power supply device is acquired, at a time of determining whether the electric power supply is continuously or periodically performed.

* * * * *